US011600325B2

(12) United States Patent
Chen et al.

(10) Patent No.: US 11,600,325 B2
(45) Date of Patent: Mar. 7, 2023

(54) NON VOLATILE RESISTIVE MEMORY LOGIC DEVICE

(71) Applicant: International Business Machines Corporation, Armonk, NY (US)

(72) Inventors: Hsueh-Chung Chen, Cohoes, NY (US); Mary Claire Silvestre, Clifton Park, NY (US); Soon-Cheon Seo, Glenmont, NY (US); Chi-Chun Liu, Altamont, NY (US); Fee Li Lie, Albany, NY (US); Chih-Chao Yang, Glenmont, NY (US); Yann Mignot, Slingerlands, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/109,296

(22) Filed: Dec. 2, 2020

(65) Prior Publication Data

US 2022/0172776 A1 Jun. 2, 2022

(51) Int. Cl.
    *G11C 11/08*     (2006.01)
    *G11C 13/00*     (2006.01)
    *G11C 11/16*     (2006.01)
    *H03K 19/20*     (2006.01)

(52) U.S. Cl.
    CPC ........ *G11C 13/004* (2013.01); *G11C 11/1673* (2013.01); *G11C 11/1675* (2013.01); *G11C 13/0069* (2013.01); *H03K 19/20* (2013.01)

(58) Field of Classification Search
    CPC .............. G11C 13/004; G11C 11/1673; G11C 11/1675; G11C 13/0069; G11C 11/161; G11C 11/1659; G11C 13/0011; H03K 19/20; H03K 19/173; H03K 19/18
    See application file for complete search history.

(56) References Cited

U.S. PATENT DOCUMENTS

| 9,934,834 | B2 * | 4/2018 | Nakatsuka | .......... G11C 11/1675 |
| 10,447,274 | B2 | 1/2019 | Lee | |
| 2019/0362765 | A1 * | 11/2019 | Park | ........................ G11C 11/39 |
| 2020/0279597 | A1 | 9/2020 | Wang | |

OTHER PUBLICATIONS

Chowdhury Zamshed I et al: "Spintronic In-Memory Pattern Matching", IEEE Journal On Exploratory Solid-State Computational Devices and Circuits, IEEE, vol. 5, No. 2, Feb. 6, 2020 (Feb. 6, 2020), pp. 206-214, XP011770602, DOI: 10.1109/JXCDC.2019.2951157.

(Continued)

*Primary Examiner* — Hien N Nguyen
(74) *Attorney, Agent, or Firm* — Matthew Zehrer

(57) ABSTRACT

A resistance switching RAM logic device is presented. The device includes a pair of resistance switching RAM cells that may be independently programed into at least a low resistance state (LRS) or a high resistance state (HRS). The resistance switching RAM logic device may further include a shared output node electrically connected to the pair of resistance switching RAM cells. A logical output may be determined from the programmed resistance state of each of the resistance switching RAM cells.

19 Claims, 9 Drawing Sheets

(56) References Cited

OTHER PUBLICATIONS

Lashkare S. et al: "Nanoscale Side-Contact Enabled Three Terminal Pr 0.7 Ca 0.3 MnO 3 Resistive Random Access Memory for In-Memory Computing", IEEE Electron Device Letters, [Online] vol. 41, No. 9, Aug. 26, 2020 (Aug. 26, 2020), pp. 1344-1347, XP055889634, USA ISSN: 0741-3106, DOI: 10.1109/LED.2020.3010858.
International Search Report and Written Opinion dated Feb. 23, 2022, for International Application No. PCT/EP2021/082281, filed Nov. 19, 2021.
Mittal, Sparsh, "A Survey of ReRAM-Based Architectures for Processing-In-Memory and Neural Networks," Mach. Learn. Knowl. Extr. 2019, 1, 75-114, Apr. 30, 2018.

* cited by examiner

NON VOLATILE RESISTIVE MEMORY LOGIC DEVICE

FIELD

Embodiments of the invention relate generally to the field of semiconductor devices and, more particularly, to a non-volatile resistive random access memory (RAM) logic device.

BACKGROUND

Integrated circuit (IC) device scaling has passed a point in which shrinking device node size may no longer be feasible. New IC devices and technologies are key to push the advance of semiconductor and IC device research. Due to the popularization of handheld devices, battery powered devices, and the like, low power technologies are primed for advances. Traditionally, a logic gate refers to a volatile silicon device which requires electrical power to maintain its value. Utilization of such traditional logic gates are therefore inefficient in finite or low power applications.

SUMMARY

In an embodiment of the present invention, a resistance switching random access memory (RAM) NAND device is presented. The device includes a first resistance switching RAM cell and a first input node electrically connected to the first resistance switching RAM cell and a second resistance switching RAM cell and a second input node electrically connected to the second resistance switching RAM cell. The device also includes a shared output node electrically connected to both the first resistance switching RAM cell and to the second resistance switching RAM cell.

In another embodiment of the present invention, a resistance switching random access memory (RAM) NAND device operating method is presented. The method includes programming, by a resistance switching RAM controller (controller), a first resistance switching RAM cell by applying a write potential pulse to a first input node electrically connected to the first resistance switching RAM cell. The method further includes programming, by the controller, a second resistance switching RAM cell by applying a write potential pulse to a second input node electrically connected to the second resistance switching RAM cell. The method further includes subsequent to programming the first input node and programming the second input node, applying, with the controller, a read potential to the first input node and to the second input node. The method further includes sensing, by the controller, a current sum, induced by the read potential applied to the first input node and to the second input node, at a shared output node that is electrically connected to both the first resistance switching RAM cell and to the second resistance switching RAM cell to determine a first resistance state of the first resistance switching RAM cell and to determine a second resistance state of the second resistance switching RAM cell. The method further includes determining, by the controller, a logical output at the shared output node based upon the determined first resistance state of the first resistance switching RAM cell and based upon the determined second resistance state of the second resistance switching RAM cell.

In another embodiment of the present invention, a resistance switching random access memory (RAM) NOR device is presented. The device includes a first resistance switching RAM cell and a second resistance switching RAM cell. The device further includes a shared input node electrically connected to both the first resistance switching RAM cell and to the second resistance switching RAM cell. The shared input node includes a first input and a second input. The device further includes a shared output node electrically connected to both the first resistance switching RAM cell and to the second resistance switching RAM cell.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
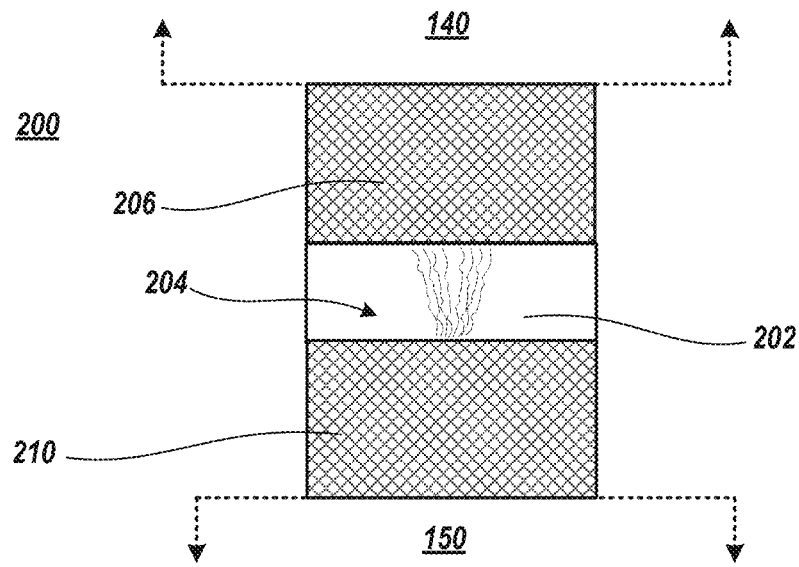
FIG. 1 depicts a cross section of a resistive random access memory (ReRAM) cell, in accordance with various embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

Referring to the drawings, wherein like components are labeled with like numerals, exemplary IC logic devices that includes one or more resistive memory cells, are shown and described in greater detail below. It should be noted that while this description may refer to some components of the IC device in the singular tense, more than one component may be included within the IC device. The specific components depicted in the drawings and the cross section orientation was chosen to best illustrate the various embodiments described herein.

A resistance switching RAM logic device is presented. The device includes a pair of resistance switching RAM cells that may be independently programed into at least a low resistance state (LRS) or a high resistance state (HRS). The resistance switching RAM logic device may further include a shared output node electrically connected to the pair of resistance switching RAM cells. A logical output may be determined from the programmed resistance state of each of the pair of resistance switching RAM cells.

FIG. 1 depicts a cross section of ReRAM cell 200, in accordance with various embodiments of the present invention.

ReRAM is a non-volatile solid-state memory technology that exploits the change in resistance switching of an insulator, such as a binary metal oxide, under an applied electric field. The fundamental storage unit (the "cell") can be programmed into at least two different states, or levels, which exhibit different resistance characteristics. The programmable cell-states can be used to represent different data values, permitting storage of information.

ReRAM architecture typically consists of a resistive switching memory cell having a metal-insulator-metal structure generally referred to as MIM structure. The structure comprises of an insulating layer (I) sandwiched between the two metal (M) electrodes. The application of a voltage pulse across the ReRAM cell enables a transition of the device from an HRS, or OFF state generally referred as logic value '0' to an LRS, or ON state, generally referred as logic value '1' and vice versa.

Typically, an as-prepared ReRAM cell is initially in the HRS and to switch the device from the HRS to the LRS, the application of voltage (e.g., high voltage pulse, write voltage, etc.) enables the formation of conductive paths, which may be referred to as filaments, in the switching layer whereby the ReRAM cell is switched into the LRS. This process occurs due to the soft breakdown of the metal insulator metal (MIM) structure is usually referred to as 'electroforming' and the voltage at which this process occurs is referred to as forming voltage. To switch the ReRAM cell from the LRS to HRS, a voltage pulse referred to as the RESET voltage is applied.

To read data from ReRAM cell, a read voltage which will not disturb the current state of the cell is applied to determine whether the cell is in the HRS or the LRS. Since both LRS and HRS retain their respective values even after the removal of applied voltage, ReRAM is a non-volatile memory.

The switching of the ReRAM cell is based on the growth of the conductive filament (CF) inside the insulating layer. The CF is a channel having a diameter of the order of nanometers which connects the top and the bottom electrodes of the memory cell. The LRS with high conductivity is obtained when the CF is connected between the electrodes and the HRS results when the filament is disconnected from the electrodes.

The exemplary ReRAM cell 200 includes insulator material 202 located between a top electrode 206 and a bottom electrode 210. The cell state shown represents an intermediate state in which CFs 204 are forming within the insulator 202. Upon formation of the CFs 204 and respective connection of the top electrode 206 and the bottom electrode 210 and when a read voltage is applied to read the programmed cell-state, the resulting read current flows primarily via the current path to/from top electrode 206 from/to bottom electrode 210 through the CF 204, in preference to flowing through the high resistance insulator material 202 in which the CFs 204 have not formed.

A top wire 140 may be connected to the top surface of the top electrode 206 and a bottom wire 150 may be connected to the bottom electrode 210. The top wire 140 and/or the bottom wire 150 may be electrically connected to other components in the IC device, such as additional wires, a memory controller, or the like.

To write to ReRAM cell 200, a write or forming voltage is applied to top electrode 206 or bottom electrode 210 and the resulting programming current through either or both electrodes causes breakdown of the metal insulator metal (MIM) structure is usually referred to as 'electroforming' and formation of CFs 204 that connect the top electrode 206 and bottom electrode 210, thereby switching the ReRAM cell 200 to the LRS from the initial HRS.

Reading of ReRAM cell 200 is performed using cell 200 resistance as a metric for cell-state. A read voltage applied to e.g., bottom electrode 210 causes a read current to flow through the cell 200. The read current is dependent on resistance across or between top electrode 206 and bottom electrode 210. Measurement of the cell read current, e.g., at top electrode 206, therefore provides an indication of the programmed cell 200 state. A sufficiently low read voltage is used for this resistance metric to ensure that application of the read voltage does not disturb the programmed cell state. Cell 200 state detection can then be performed by comparing the resistance metric with predefined reference levels for the programmable cell states.

Figure 2:
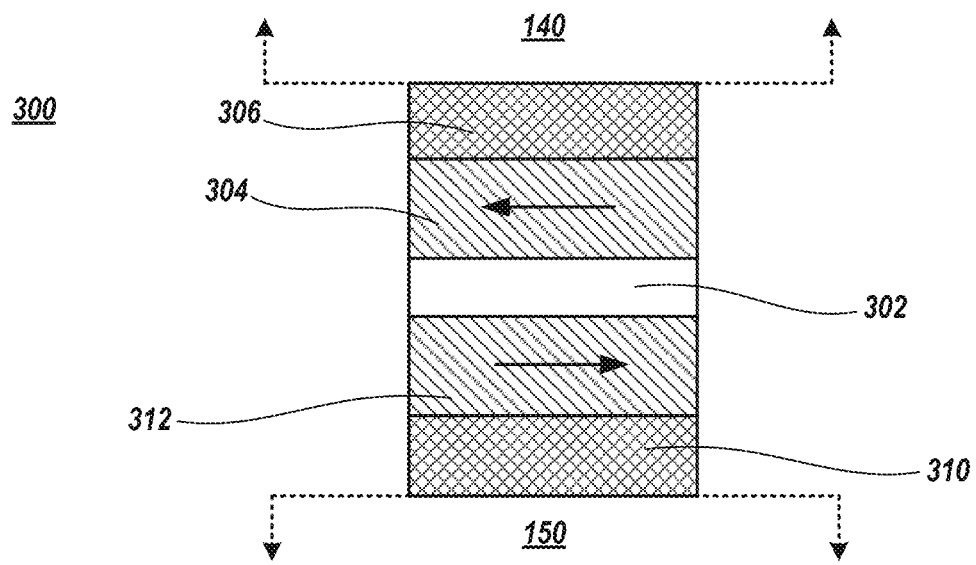
FIG. 2 depicts a cross section of a magnetoresistive random-access memory (MRAM) cell, in accordance with various embodiments of the present invention.

FIG. 2 depicts a cross section of MRAM cell 300, in accordance with various embodiments of the present invention.

MMRAM is a non-volatile solid-state memory technology that exploits the change in resistance switching of an insulator relative to the magnetic orientation of two ferromagnetic plates. The fundamental storage unit (the "cell") can be programmed into at least two different states, or levels, which exhibit different resistance characteristics. The programmable cell-states can be used to represent different data values, permitting storage of information.

MMRAM architecture typically relies upon a magnetic tunnel junction (MJR) structure where two ferromagnetic layers are separated by a dielectric spacer layer, which may also be referred to as a tunnel barrier. When the tunnel barrier is very thin, typically <2 nm, quantum mechanical tunneling of electrons through the barrier makes the MTJ behave like a resistor having a resistance that depends exponentially on the barrier thickness and is proportional to the inverse of the in-plane barrier area. The tunneling current is spin-polarized, due to the asymmetric band structure of the ferromagnetic electrodes, giving rise to the tunneling magnetoresistance.

The relative orientation of the magnetizations in these two layers determines the resistance of the MTJ structure. For most materials, the LRS is when the magnetizations of the two layers are parallel, because the majority band electrons can tunnel into the majority band on the opposite side of the barrier. The HRS exists when the orientation is antiparallel, since the majority band electrons have to tunnel into the minority band of the opposite layer.

One of the ferromagnetic layers is a free layer, sometimes called recording layer or storage layer, and is the ferromagnetic layer retaining the stored information. The tunnel barrier is typically an insulating non-magnetic layer, that provides means to switch and read the state of the free layer with a spin-polarized tunneling current. The other ferromagnetic layer is a fixed or reference layer and provides a stable reference magnetization direction for the free layer reading and switching. This fixed layer is designed to have magnetic anisotropy much higher than the free layer so that it never switches during memory operation.

Data may be written to the MRAM cell by applying a write voltage to a top electrode and/or the bottom electrode, respectively above and below the MRJ structure, which causes electrical current to directionally flow therethrough. The current flow direction (e.g. into the page or out of the page) through the electrode(s) induces an opposing directional magnetic field, which the free layer adopts. When the magnetic field direction in the free layer is parallel with the magnetic field direction of the fixed layer, the MRAM cell is in the LRS. When the magnetic field direction in the free layer is antiparallel with the magnetic field direction of the fixed layer, the MRAM cell is in the HRS.

To read data from the MRAM cell, a read voltage which will not disturb the current state of the cell is applied to determine whether the cell is in the HRS or the LRS. Since both LRS and HRS retain their respective values even after the removal of applied voltage, ReRAM is a non-volatile memory.

After the MRAM cell has been read, a rest operation may force current through the electrode(s) and induce the magnetic field direction in the free layer to be antiparallel with the magnetic field direction of the fixed layer, to place the MRAM cell in the HRS.

The exemplary MRAM cell 300 includes barrier layer 302 located between a top ferromagnetic fixed layer 304 and a bottom ferromagnetic free layer 312. MRAM cell 300 further includes a top electrode 306 connected to the top surface of the top ferromagnetic fixed layer 304 and may include a bottom electrode 310 connected to the bottom surface of the bottom ferromagnetic free layer 312. The cell state shown represents the HRS state in which the magnetic orientation between top ferromagnetic fixed layer 304 and bottom ferromagnetic free layer 312 is antiparallel.

A top wire 140 may be connected to the top surface of the top electrode 306 and a bottom wire 150 may be connected to the bottom electrode 310. The top wire 140 and/or the bottom wire 150 may be electrically connected to other components in the IC device, such as a memory controller, or the like, as is known in the art. The top wire 140 and/or the bottom wire 150 may be electrically connected to other components in the IC device, such as additional wires, a memory controller, or the like.

To write to MRAM cell 300, a write voltage is applied to e.g. bottom electrode 310 and/or bottom wire 150 and electrical current flows therethrough. The current flow through the bottom wire 150 and/or electrode 310 induces a magnetic field, which the free layer 312 adopts. In the depicted state, the current flows through bottom wire 150 and/or bottom electrode 310 in the direction into the page causing a clockwise directional magnetic field around bottom electrode 310, which the free layer 312 adopts, thereby switching the MRAM cell 300 to the HRS. Similarly, the write voltage may be applied to e.g. to bottom wire 150 and/or electrode 310 that causes current to flows through bottom electrode 310 in the direction out the page causing a counter-clockwise directional magnetic field around bottom electrode 310, which the free layer 312 adopts, thereby switching the MRAM cell 300 to the LRS.

Reading of MRAM cell 300 is performed using cell 300 resistance as a metric for cell-state. A read voltage applied to e.g., bottom electrode 310 causes a read current to flow through the cell 300. The read current is dependent on resistance across or between top electrode 306 and bottom electrode 310. Measurement of the cell read current, e.g., at top electrode 306, therefore provides an indication of the programmed cell 300 state. A sufficiently low read voltage is used for this resistance metric to ensure that application of the read voltage does not disturb the programmed cell state. Cell 300 state detection can then be performed by comparing the resistance metric with predefined reference levels for the programmable cell states.

Figure 3:
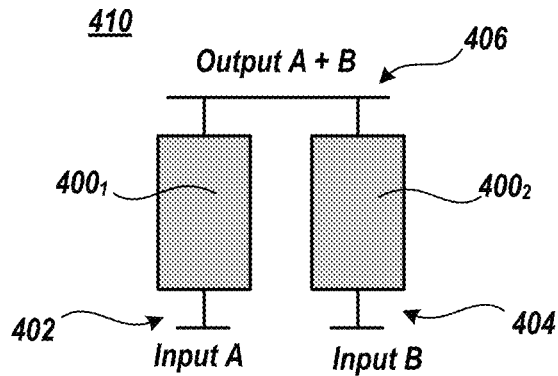
FIG. 3 depicts a circuit schematic of a non-volatile resistive RAM logic gate, in accordance with various embodiments of the present invention.

FIG. 3 depicts a circuit schematic of a non-volatile resistive RAM logic gate (RRLG) 410, in accordance with various embodiments of the present invention. RRLG 410 includes a pair of non-volatile resistive RAM cells 400$_1$ and 400$_2$. Resistive RAM cell 400 may be any one of ReRAM cell 200, MRAM cell 300, or the like.

RAM cells 400$_1$ and 400$_2$ may be the same type of resistive memory cell. For example, RAM cells 400$_1$ and 400$_2$ may be both ReRAM 200 type resistive memory cells. Alternatively, RAM cells 400$_1$ and 400$_2$ may be a different type of resistive memory cell. For example, RAM cell 400$_1$ may be a ReRAM 200 type resistive memory cell and RAM cell 400$_2$ may be a MRAM cell 200 type resistive memory cell.

RRLG further includes an input node 402 electrically connected to RAM cell 400$_1$ and an input node 404 electrically connected to RAM cell 400$_2$. Input node 402 is generally an electrically conductive pathway that may comprise wires, VIAs, interconnects, or the like. Input node 404 is generally an electrically conductive pathway that may comprise wires, VIAs, interconnects, or the like. Input node 402 and input node 404 are electrically distinct or independent nodes.

In ReRAM cell 200 embodiments, input node 402 and/or input node 404 may be electrically connected to a bottom wire 150, bottom electrode 210, or the like, of a respective ReRAM cell 200. In MRAM cell 300 embodiments, input node 402 and/or input node 404 may be electrically connected to a bottom wire 150, bottom electrode 310, or the like, of a respective MRAM cell 300.

RRLG 410 further includes an output node 406 that is electrically connected to an output of RAM cell 400$_1$ and electrically connected to an output of RAM cell 400$_2$. Output node 406 is generally an electrically conductive pathway that may comprise wires, VIAs, interconnects, or the like. Output node 406 generally ties the output of RAM cell 400₁ and the output of RAM cell 400₂ into a single output. Due to this shared output, RAM cell 400₁ and RAM cell 400₂ are linked, tied, or are otherwise connected.

In ReRAM cell 200 embodiments, output node 406 may be electrically connected to a top wire 140, top electrode 206, or the like, of a ReRAM cell 200. In MRAM cell 300 embodiments, output node 406 may be electrically connected to a top wire 140, top electrode 306, or the like, of a MRAM cell 300.

For clarity, the relative relationship between the input nodes 402, 404 or the output node 406 and the top or bottom conductive features of the cell may be reversed (e.g., input node 402, 404 may be electrically connected to the top conductive feature of the respective cells and output node 406 may be connected to the bottom conductive feature of the cells).

Figure 4:
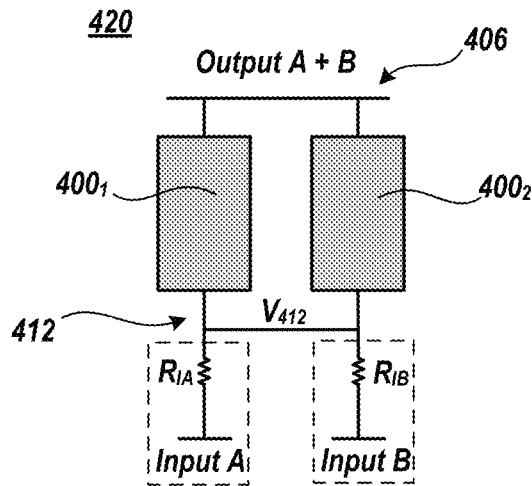
FIG. 4 depicts a circuit schematic of a non-volatile resistive RAM logic gate, in accordance with various embodiments of the present invention.

FIG. 4 depicts a circuit schematic of a RRLG 420, in accordance with various embodiments of the present invention. RRLG 420 includes a pair of non-volatile resistive RAM cells 400₁ and 400₂.

RRLG 420 further includes an input node 412 electrically connected to an input of RAM cell 400₁ and electrically connected to an input of RAM cell 400₂. Input node 412 is generally an electrically conductive pathway that may comprise wires, VIAs, interconnects, or the like. Input node 412 generally ties the input of RAM cell 400₁ and the input of RAM cell 400₂ into a single input. Due to this shared input, RAM cell 400₁ and RAM cell 400₂ are linked, tied, or are otherwise connected.

The voltage at input node 412 is $$V_{412} \cdot V_{412} = V_{input\ A} * \frac{R_{IB}}{R_{IA} + R_{IB}} + V_{input\ B} * \frac{R_{IA}}{R_{IA} + R_{IB}}.$$

$R_{IA}$ is the internal resistance of the Input A source, $R_{IB}$ is the internal resistance of the Input B source. We assume $R_{IA}$ is approximately equal to $R_{IB}$ Therefore, when the voltage $V_{Input\ A}$ and the voltage $V_{Input\ B}$ are the same or approximately the same, the voltage $V_{412}$ equals the applied voltage at input A and the applied voltage at input B. When either voltage $V_{Input\ A}$ or voltage $V_{Input\ B}$ is much larger than the other, the voltage $V_{412}$ equals or is approximately equal to the larger voltage $V_{Input\ A}$ or voltage $V_{Input\ B}$.

The Input A source and the Input B source may source current and not sink current. For example, the Input A source or the Input B source with the slightly higher voltage provides the current until the higher source goes into current limit. The voltage of the higher source may fall slightly and both Input A source and the Input B source conduct or source current, respectively. If the Input A source and the Input B source are noticeably different voltages, the higher voltage source may provide all the current to the load, RAM cell 400₁ and RAM cell 400₂. The lower voltage source may see the voltage at $V_{412}$ as top high already and provide no current.

In ReRAM cell 200 embodiments, input node 412 may be electrically connected to a bottom wire 150, bottom electrode 210, or the like, of a respective ReRAM cell 200. In MRAM cell 300 embodiments, input node 412 may be electrically connected to a bottom wire 150, bottom electrode 310, or the like, of a respective MRAM cell 300. RRLG 420 further includes an output node 406 that is electrically connected to an output of RAM cell 400₁ and electrically connected to an output of RAM cell 400₂.

In ReRAM cell 200 embodiments, output node 406 may be electrically connected to a top wire 140, top electrode 206, or the like, of a ReRAM cell 200. In MRAM cell 300 embodiments, output node 406 may be electrically connected to a top wire 140, top electrode 306, or the like, of a MRAM cell 300.

For clarity, the relative relationship between the input nodes 402, 404 or the output node 406 and the top or bottom conductive features of the cell may be reversed (e.g., input node 412 may be electrically connected to the top conductive feature of the cells and output node 406 may be connected to the bottom conductive feature of the cells).

Figure 5:
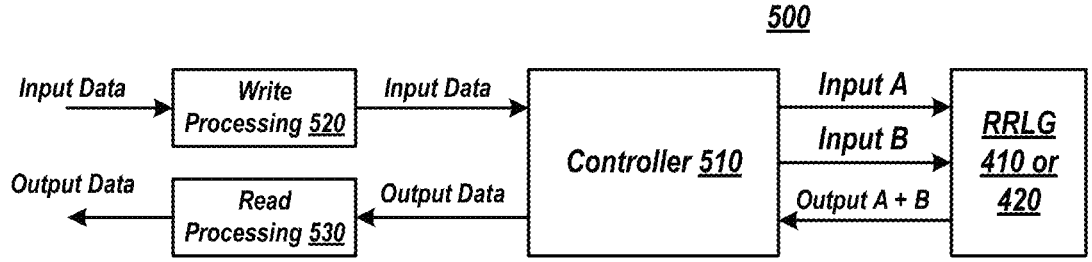
FIG. 5 is a block diagram of a memory device embodying a non-volatile resistive RAM logic gate, in accordance with various embodiments of the present invention.

FIG. 5 is a block diagram of a memory device 500 embodying the RRLG 410 and/or the RRLG 420, in accordance with various embodiments of the present invention. Device 500 includes RRLG 410 and/or the RRLG 420 for storing data in and/or reading data from at the pair of RAM cell 400₁ and RAM cell 400₂. Reading and writing of data to RAM cell 400₁ and RAM cell 400₂ may be performed by a read/write controller, or controller, 510. Controller 510 includes circuitry of generally known form for programming appropriate one or more cells during data write operations and making read measurements for detecting respective cell state during data read operations of one or more cells. During these operations, the read/write controller 510 can address individual cells by applying appropriate control signals to an array of word and bit lines in memory ensemble. Input data, or data to be written, to device 500 may be subjected to some form of write-processing, such as coding for error-correction purposes, by write-processing module 520, before being supplied as input data to controller 510. Similarly, output data, or data read, by controller 510 may be processed by a read-processing module 530, e.g., for codeword detection and/or error correction, to recover the original input data.

The RAM cell 400₁ and RAM cell 400₂ can store information in at least two programmable cell states. As discussed earlier, the programmable cell-states correspond to different relative resistances across respective RAM cell 400₁ and RAM cell 400₂. These states include at least an HRS and an LRS. The programmable cell-states are typically defined in controller 510 in terms of predetermined reference values, or ranges of values, of the resistance metric used for read detection. To program RAM cell 400₁ and RAM cell 400₂ in a write operation, controller 510 applies a write voltage, set voltage, program voltage, or the like to the RAM cell 400₁ via the word and bit lines (e.g., top electrode, bottom electrode, or the like) such that the resulting programming signal (i.e. input A) sets the RAM cell 400₁ to the required state applies a write voltage, set voltage, program voltage, or the like to the RAM cell 400₂ via the word and bit lines such that the resulting programming signal (i.e. input B) sets the RAM cell 400₂ to the required state. In a read operation, a (lower) read voltage is applied to the cells and the resulting cell current is measured to obtain the resistance metric. Controller 510 can then detect the programmed RAM cell 400₁ state by comparing the output A of RAM cell 400₁ with the aforementioned appropriate reference values and can then detect the programmed RAM cell 400₂ state by comparing the output B of RAM cell 400₂ with the aforementioned appropriate reference values. Controller 510 can then detect the output at node 406 by logically combining the programmed output A RAM cell 400₁ state with the programmed output B RAM cell 400₂ state, as is detailed herein.

Figure 6:
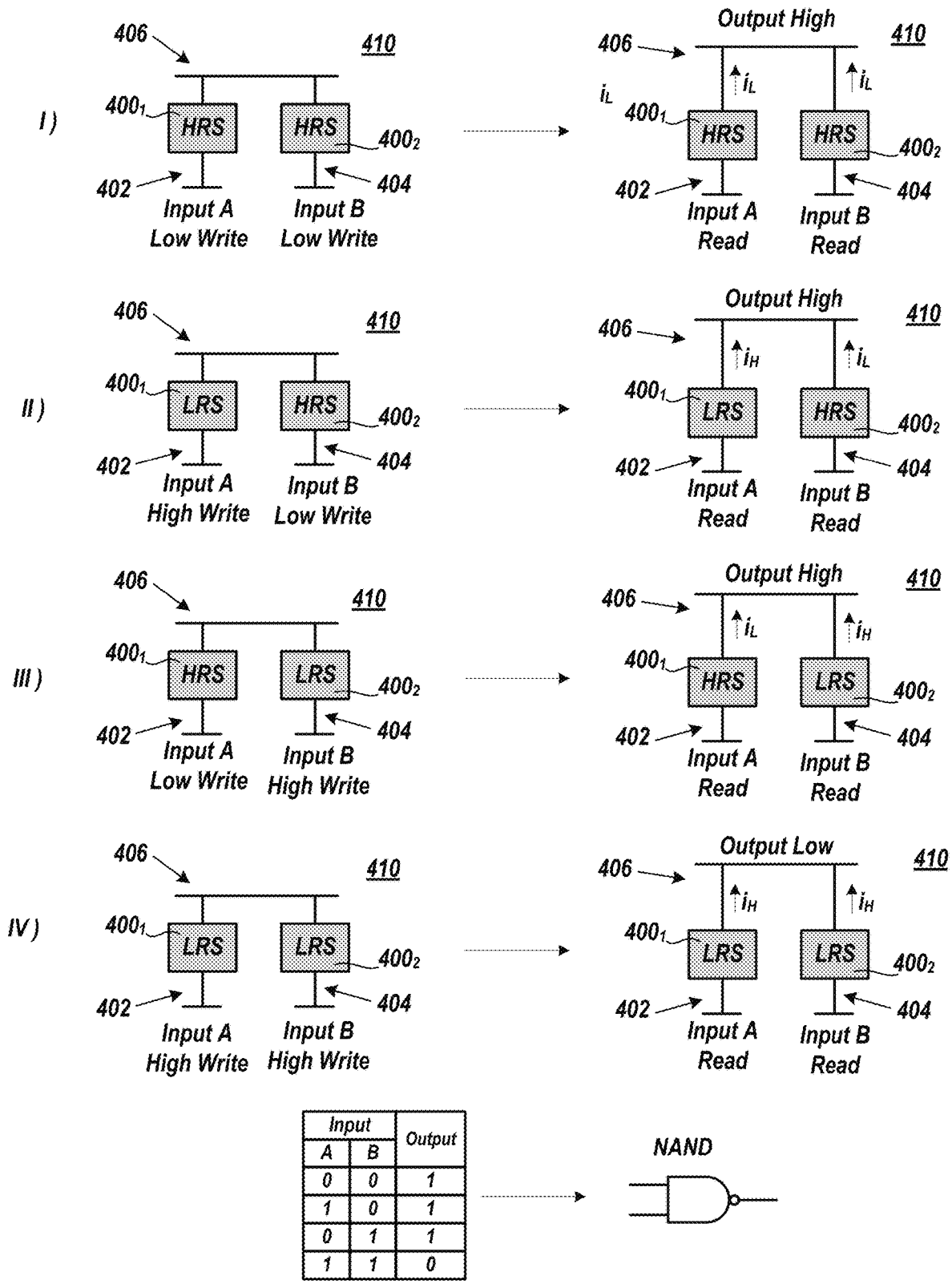
FIG. 6 depicts various logic states of a non-volatile resistive RAM logic gate, in accordance with various embodiments of the present invention.

FIG. 6 depicts various logic states of RRLG 410 in a NAND logic gate configuration, in accordance with various embodiments of the present invention. A NAND gate is a logic gate which produces an output which is false only if all its inputs are true. Thus, a low '0' output results only if all the inputs to the gate are high '1'. If any input is low '0', a high '1' output results.

In the depicted (I) example, a low write voltage is written as input A at input node 402 to RAM cell $400_1$ and a low write voltage is written as input B at input node 404 to RAM cell $400_2$. The low write voltage may be a quantitative measurement or value when associated with ReRAM cell 200 embodiments, may be a directional or orientational measurement value when associated with MRAM cell 300 embodiments. The low write voltage applied to RAM cell $400_1$ and to RAM cell $400_2$ results in both RAM cell $400_1$ and RAM cell $400_2$ being programmed in the HRS and each RAM cell $400_1$ and RAM cell $400_2$ resultantly acquiring or maintaining a respective logic value '0.'

In ReRAM cell 200 embodiments, a low write voltage is applied to ReRAM cell $200_1$ and ReRAM cell $200_2$ and the resulting programming current through ReRAM cell $200_1$ and ReRAM cell $200_2$ does not cause sufficient breakdown of the MIM structure and sufficient formation of CFs 204 do not occur. This results in the HRS of ReRAM cell $200_1$ and HRS of ReRAM cell $200_2$ and the ReRAM cell $200_1$ and ReRAM cell $200_2$ both effectively storing a logic value of '0' ReRAM cell $200_1$ and ReRAM cell $200_2$ retain their respective HRS even after the removal of the applied write voltage and, as such, ReRAM cell $200_1$ and ReRAM cell $200_2$ are a non-volatile.

In MRAM cell 300 embodiments, a low write voltage is applied to MRAM cell $300_1$ and MRAM cell $300_2$ and the resulting programming current associated with MRAM cell $300_1$ and MRAM cell $300_2$ causes e.g., the appropriate magnetic field such that, in each cell, the magnetic field orientation in free layer 312 is antiparallel with the magnetic field orientation of fixed layer 304, respectively, thereby placing both the MRAM cell $300_1$ and the MRAM cell $300_2$ in the HRS whereby the MRAM cell $300_1$ and the MRAM cell $300_2$ both effectively store a logic value of '0' MRAM cell $300_1$ and MRAM cell $300_2$ retain their respective HRS even after the removal of the applied write voltage and, as such, MRAM cell $300_1$ and MRAM cell $300_2$ are a non-volatile.

In the depicted (II) example, a high write voltage is written as input A at input node 402 to RAM cell $400_1$ and a low write voltage is written as input B at input node 404 to RAM cell $400_2$. The high write voltage applied to RAM cell $400_1$ and the low write voltage applied to RAM cell $400_2$ results in RAM cell $400_1$ being programmed in the LRS and resultantly acquiring a respective logic value 1' and RAM cell $400_2$ being programmed in the HRS and resultantly acquiring or maintaining a respective logic value '0.'

In ReRAM cell 200 embodiments, a high write voltage is applied to ReRAM cell $200_1$ and a low write voltage is applied to ReRAM cell $200_2$. The resulting programming current through ReRAM cell $200_2$ does not cause sufficient breakdown of the MIM structure and sufficient formation of CFs 204 do not occur. This results in the HRS of ReRAM cell $200_2$ and ReRAM cell $200_2$ effectively stores a logic value of '0' The resulting programming current through ReRAM cell $200_1$ does cause sufficient breakdown of the MIM structure and sufficient formation of CFs 204 does occur. This results in the LRS of ReRAM cell $200_1$ and ReRAM cell $200_1$ effectively stores a logic value of '1'. ReRAM cell $200_1$ retains the LRS and ReRAM cell $200_2$ retains the HRS even after the removal of the applied write voltage and, as such, ReRAM cell $200_1$ and ReRAM cell $200_2$ are a non-volatile.

In MRAM cell 300 embodiments, a high write voltage is applied to MRAM cell $300_1$ and a low write voltage is applied to MRAM cell $300_2$. The resulting programming current associated with MRAM cell $300_2$ causes the appropriate magnetic field such that, in e MRAM cell $300_2$, the magnetic field orientation in free layer 312 is antiparallel with the magnetic field orientation of fixed layer 304, thereby placing MRAM cell $300_2$ in the HRS and whereby the MRAM cell $300_2$ effectively stores a logic value of '0' The resulting programming current associated with MRAM cell $300_1$ causes the appropriate magnetic field such that, in e MRAM cell $300_1$, the magnetic field orientation in free layer 312 is parallel with the magnetic field orientation of fixed layer 304, thereby placing MRAM cell $300_1$ in the LRS and whereby the MRAM cell $300_1$ effectively stores a logic value of '1' MRAM cell $300_1$ retains the LRS and MRAM cell $300_2$ retains the HRS even after the removal of the applied write voltage and, as such, MRAM cell $300_1$ and MRAM cell $300_2$ are a non-volatile.

In the depicted (III) example, a low write voltage is written as input A at input node 402 to RAM cell $400_1$ and a high write voltage is written as input B at input node 404 to RAM cell $400_2$. The low write voltage applied to RAM cell $400_1$ and the high write voltage applied to RAM cell $400_2$ results in RAM cell $400_1$ being programmed in the HRS and resultantly acquiring or maintaining a respective logic value '0' and RAM cell $400_2$ being programmed in the LRS and resultantly acquiring a respective logic value '1.'

In ReRAM cell 200 embodiments, a low write voltage is applied to ReRAM cell $200_1$ and a high write voltage is applied to ReRAM cell $200_2$. The resulting programming current through ReRAM cell $200_2$ does cause sufficient breakdown of the MIM structure and sufficient formation of CFs 204 do occur. This results in the LRS of ReRAM cell $200_2$ and ReRAM cell $200_2$ effectively stores a logic value of '1'. The resulting programming current through ReRAM cell $200_1$ does not cause sufficient breakdown of the MIM structure and sufficient formation of CFs 204 does not occur. This results in the HRS of ReRAM cell $200_1$ and ReRAM cell $200_1$ effectively stores a logic value of '0' ReRAM cell $200_1$ retains the HRS and ReRAM cell $200_2$ retains the LRS even after the removal of the applied write voltage and, as such, ReRAM cell $200_1$ and ReRAM cell $200_2$ are a non-volatile.

In MRAM cell 300 embodiments, a low write voltage is applied to MRAM cell $300_1$ and a high write voltage is applied to MRAM cell $300_2$. The resulting programming current associated with MRAM cell $300_2$ causes the appropriate magnetic field such that, in MRAM cell $300_2$, the magnetic field orientation in free layer 312 is parallel with the magnetic field orientation of fixed layer 304, thereby placing MRAM cell $300_2$ in the LRS and whereby the MRAM cell $300_2$ effectively stores a logic value of '1' The resulting programming current associated with MRAM cell $300_1$ causes the appropriate magnetic field such that, in MRAM cell $300_1$, the magnetic field orientation in free layer 312 is antiparallel with the magnetic field orientation of fixed layer 304, thereby placing MRAM cell $300_1$ in the HRS and whereby the MRAM cell $300_1$ effectively stores a logic value of '0' MRAM cell $300_1$ retains the HRS and MRAM cell $300_2$ retains the LRS even after the removal of the applied write voltage and, as such, MRAM cell $300_1$ and MRAM cell $300_2$ are a non-volatile.

In the depicted (IV) example, a high write voltage is written as input A at input node 402 to RAM cell 400$_1$ and a high write voltage is written as input B at input node 404 to RAM cell 400$_2$. The high write voltage applied to RAM cell 400$_1$ and the high write voltage applied to RAM cell 400$_2$ results in RAM cell 400$_1$ being programmed in the LRS and resultantly acquiring a logic value '0' and RAM cell 400$_2$ being programmed in the LRS and resultantly acquiring a respective logic value '1.'

In ReRAM cell 200 embodiments, a high write voltage is applied to ReRAM cell 200$_1$ and a high write voltage is applied to ReRAM cell 200$_2$. The resulting programming current through ReRAM cell 200$_2$ causes sufficient breakdown of the MIM structure and sufficient formation of CFs 204 occurs. This results in the LRS of ReRAM cell 200$_2$ and ReRAM cell 200$_2$ effectively stores a logic value of '1'. Likewise, the resulting programming current through ReRAM cell 200$_1$ also causes sufficient breakdown of the MIM structure and sufficient formation of CFs 204 occurs. This results in the LRS of ReRAM cell 200$_1$ and ReRAM cell 200$_1$ effectively stores a logic value of '1' ReRAM cell 200$_1$ and ReRAM cell 200$_2$ retains the LRS even after the removal of the applied write voltage and, as such, ReRAM cell 200$_1$ and ReRAM cell 200$_2$ are a non-volatile.

In MRAM cell 300 embodiments, a high write voltage is applied to MRAM cell 300$_1$ and a high write voltage is applied to MRAM cell 300$_2$. The resulting programming current associated with MRAM cell 300$_2$ causes the appropriate magnetic field such that, in MRAM cell 300$_2$, the magnetic field orientation in free layer 312 is parallel with the magnetic field orientation of fixed layer 304, thereby placing MRAM cell 300$_2$ in the LRS and effectively storing s a logic value of '1'. The resulting programming current associated with MRAM cell 300$_1$ causes the appropriate magnetic field such that, in MRAM cell 300$_1$, the magnetic field orientation in free layer 312 is parallel with the magnetic field orientation of fixed layer 304, thereby placing MRAM cell 300$_1$ in the LRS and effectively storing a logic value of '1' MRAM cell 300$_1$ retains the LRS and MRAM cell 300$_2$ retains the LRS even after the removal of the applied write voltage and, as such, MRAM cell 300$_1$ and MRAM cell 300$_2$ are a non-volatile.

To determine the output at node 406, a read voltage is applied to RAM cell 400$_1$ and a read voltage is applied to RAM cell 400$_2$ which causes a read current to flow through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum may be, for example, low current (i.e., $i_L+i_L$) when RAM cell 400$_1$ and RAM cell 400$_2$ are each in the HRS, intermediate current (i.e., $i_L+i_H$) when one of RAM cell 400$_1$ or RAM cell 400$_2$ is in the HRS and the other of RAM cell 400$_1$ or RAM cell 400$_2$ is in the LRS, or high current (i.e., $i_H+i_H$) when RAM cell 400$_1$ and RAM cell 400$_2$ are each in the LRS.

A resistance metric may be determined from the sensed current sum at node 406. For example, controller 510 may include a data structure that links a high resistance metric to the sensed low current (i.e., $i_L+i_L$) plus or minus an appropriate tolerance, that links an intermediate resistance metric to the sensed intermediate current (i.e., $i_L+i_H$) plus or minus an appropriate tolerance, and that links a low resistance metric to the high current (i.e., $i_H+i_H$) plus or minus an appropriate tolerance. As such, when the current sum at node 406 is sensed, the resistance metric may be determined therefrom.

A predetermined reference value may be linked to a logical value "0" or "1". For example, a predetermined high resistance reference value may be linked to the logical value "1", "high", or "ON," a predetermined mid resistance reference value may be linked to the logical value "1", "high", or "ON," and a predetermined low resistance reference value may be linked to the logical value "0", "low", or "OFF." For example, controller 510 may include a data structure that links a predetermined high resistance reference value, plus or minus a predetermined tolerance, to the logical value "1", that links a predetermined mid resistance reference value, plus or minus a predetermined tolerance, to the logical value "1", and a predetermined low resistance reference value, plus or minus a predetermined tolerance, to the logical value "0". The determined resistance metric may be compared against the predetermined resistance reference values to determine the appropriate logical value. For example, the determined resistance metric may be within the tolerance of the high resistance reference value and output at node 406 would therefore be a logical value '1', may be within the tolerance of the intermediate resistance value and output at node 406 would therefore be a logical value '1', or may be within the tolerance of the low resistance value and output at node 406 would therefore be a logical value '0'.

In the depicted (I) example, a read voltage is applied to RAM cell 400$_1$ and a read voltage is applied to RAM cell 400$_2$ which causes a read current to flow through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum, as depicted, is the low current sum (i.e., $i_L+i_L$) as RAM cell 400$_1$ and RAM cell 400$_2$ are both in the HRS. The sensed low current sum indicates the high resistance metric. The high resistance metric is within the tolerance of the predetermined high resistance reference value which indicates the output at node 406 as the logical value "1", "high", "TRUE", or the like.

In the depicted (II) example, a read voltage is applied to RAM cell 400$_1$ and a read voltage is applied to RAM cell 400$_2$ which causes a read current to flow through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum, as depicted, is the intermediate current sum (i.e., $i_H+i_L$) as RAM cell 400$_1$ is in the LRS and RAM cell 400$_2$ is in the HRS. The sensed intermediate current sum indicates the intermediate resistance metric. The intermediate resistance metric is within the tolerance of the predetermined intermediate resistance reference value which indicates the output at node 406 as the logical value "1", "high", "TRUE", or the like.

In the depicted (III) example, a read voltage is applied to RAM cell 400$_1$ and a read voltage is applied to RAM cell 400$_2$ which causes a read current to flow through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum, as depicted, is the intermediate current sum (i.e., $i_L+i_H$) as RAM cell 400$_1$ is in the HRS and RAM cell 400$_2$ is in the LRS. The sensed intermediate current sum indicates the intermediate resistance metric. The intermediate resistance metric is within the tolerance of the predetermined intermediate resistance reference value which indicates the output at node 406 as the logical value "1", "high", "TRUE", or the like.

In the depicted (IV) example, a read voltage is applied to RAM cell 400$_1$ and a read voltage is applied to RAM cell 400$_2$ which causes a read current to flow through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum, as depicted, is the high current sum (i.e., $i_H + i_H$) as RAM cell 400$_1$ is in the LRS and RAM cell 400$_2$ is in the LRS. The sensed high current sum indicates the low resistance metric. The low resistance metric is within the tolerance of the predetermined low resistance reference value which indicates the output at node 406 as the logical value "0", "low", "FALSE", or the like.

The input A, input B, and output at node 406 is shown in the depicted truth table. The truth table shows that the output at node 406 is false only if the input A and input B are true. Thus, a low '0' output at node 406 results only if both the input A and input B to the RRLG 410 are high '1'. If the input A or input B is low '0', a high '1' output at node 406 results. Therefore, as depicted, RRLG 410 is configured as a NAND device.

Figure 7:
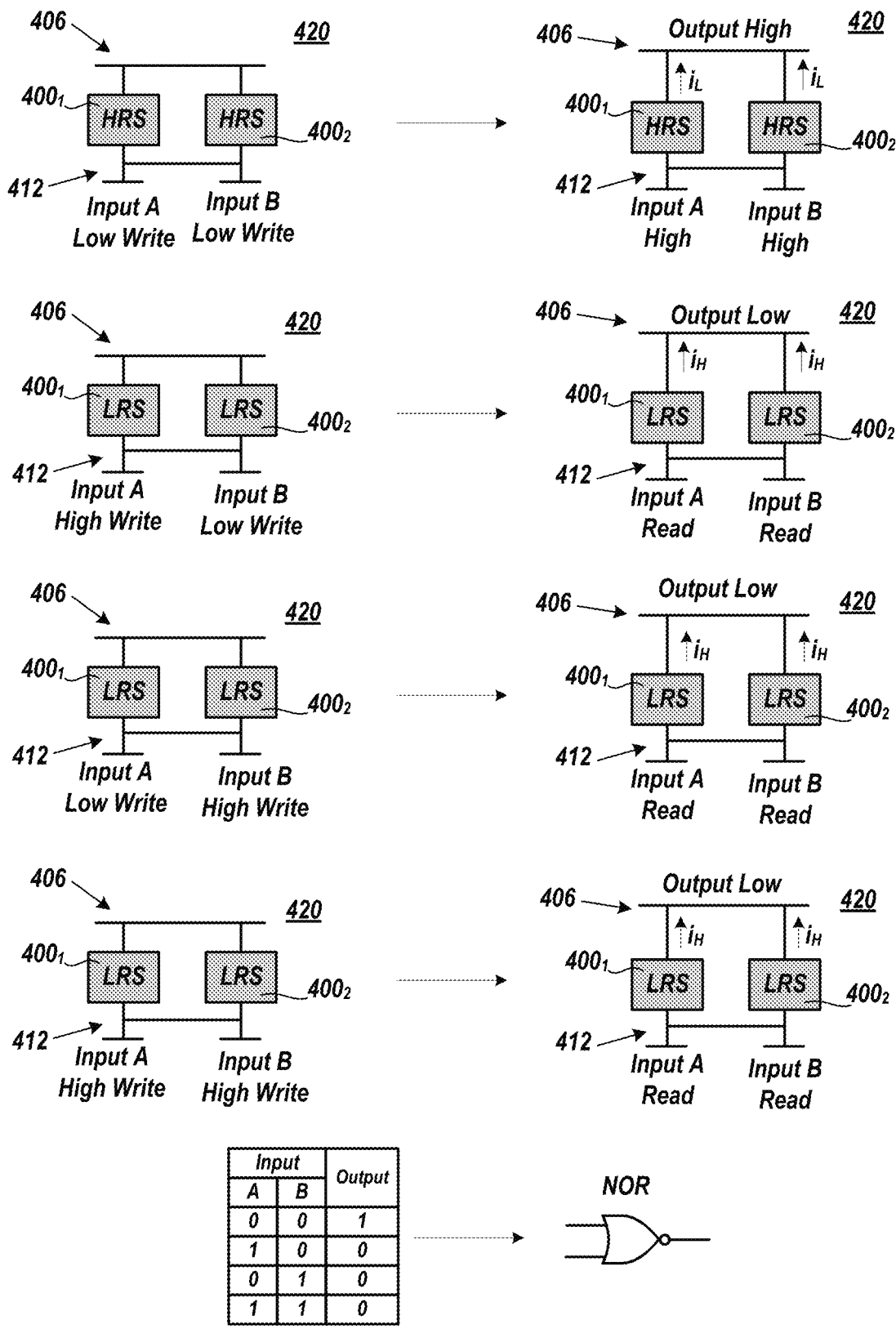
FIG. 7 depicts various logic states of a non-volatile resistive RAM logic gate, in accordance with various embodiments of the present invention.

FIG. 7 depicts various logic states of RRLG 420 in a NOR logic gate configuration, in accordance with various embodiments of the present invention. A NOR gate is a logic gate which produces a positive output only when both inputs are negative. Thus, a high '1' output results if both the inputs are low '0'. If one or both input is high '1', a low '0' output results.

In the depicted (I) example, a low write voltage is applied as input A and a low write voltage is applied as input B. The low write voltage is therefore adopted as the voltage at node 412. A resulting programming current through each RAM cell 400$_1$ and RAM cell 400$_2$ results in the RAM cell 400$_1$ and the RAM cell 400$_2$ being programmed in the HRS. Each RAM cell 400$_1$ and RAM cell 400$_2$ resultantly acquires or maintains a respective logic value '0.'

In ReRAM cell 200 embodiments, a low write voltage is applied at both input A and at input B. The low write voltage is therefore adopted as the voltage at node 412. A resulting programming current through ReRAM cell 200$_1$ and a resulting programming current through ReRAM cell 200$_2$ does not cause sufficient breakdown of the MIM structure and sufficient formation of CFs 204 does not occur. This results in the HRS of ReRAM cell 200$_1$ and HRS of ReRAM cell 200$_2$ and the ReRAM cell 200$_1$ and ReRAM cell 200$_2$ both effectively store a logic value of '0' ReRAM cell 200$_1$ and ReRAM cell 200$_2$ retain their respective HRS even after the removal of the applied write voltage and, as such, ReRAM cell 200$_1$ and ReRAM cell 200$_2$ are a non-volatile.

In MRAM cell 300 embodiments, a low write voltage is applied at both input A and at input B. The low write voltage is therefore adopted as the voltage at node 412. A resulting programming current associated with MRAM cell 300$_1$ and a resulting programming current through MRAM cell 300$_2$ causes an magnetic field such that, in each cell, the magnetic field orientation in free layer 312 is antiparallel with the magnetic field orientation of fixed layer 304, respectively. This places both the MRAM cell 300$_1$ and the MRAM cell 300$_2$ in the HRS and the MRAM cell 300$_1$ and the MRAM cell 300$_2$ both effectively store a logic value of '0' MRAM cell 300$_1$ and MRAM cell 300$_2$ retain their respective HRS even after the removal of the applied write voltage and, as such, MRAM cell 300$_1$ and MRAM cell 300$_2$ are a non-volatile.

In the depicted (II) example, a high write voltage is applied as input A and a low write voltage is applied as input B. The high write voltage is therefore adopted as the voltage at node 412. A resulting programming current through each RAM cell 400$_1$ and RAM cell 400$_2$ results in both RAM cell 400$_1$ and RAM cell 400$_2$ being programmed in the LRS and resultantly acquiring a respective logic value '1'.

In ReRAM cell 200 embodiments, a high write voltage is applied as input A and a low write voltage is applied as input B. The high write voltage is therefore adopted as the voltage at node 412. A resulting programming current through ReRAM cell 200$_2$ does cause sufficient breakdown of the MIM structure and sufficient formation of CFs 204 does occur. This results in the LRS of ReRAM cell 200$_2$ and ReRAM cell 200$_2$ effectively stores a logic value of '1' A resulting programming current through ReRAM cell 200$_1$ also causes sufficient breakdown of the MIM structure and sufficient formation of CFs 204. This results in the LRS of ReRAM cell 200$_1$ and ReRAM cell 200$_1$ effectively stores a logic value of '1'. ReRAM cell 200$_1$ retains the LRS and ReRAM cell 200$_2$ retains the LRS even after the removal of the applied write voltage and, as such, ReRAM cell 200$_1$ and ReRAM cell 200$_2$ are a non-volatile.

In MRAM cell 300 embodiments, a high write voltage is applied as input A and a low write voltage is applied as input B. The high write voltage is therefore adopted as the voltage at node 412. A resulting programming current associated with MRAM cell 300$_2$ causes the appropriate magnetic field such that, in MRAM cell 300$_2$, the magnetic field orientation in free layer 312 is parallel with the magnetic field orientation of fixed layer 304, thereby placing MRAM cell 300$_2$ in the LRS, whereby the MRAM cell 300$_2$ effectively stores a logic value of '1' A resulting programming current associated with MRAM cell 300$_1$ causes the appropriate magnetic field such that, in MRAM cell 300$_1$, the magnetic field orientation in free layer 312 is parallel with the magnetic field orientation of fixed layer 304, thereby placing MRAM cell 300$_1$ in the LRS, whereby the MRAM cell 300$_1$ effectively stores a logic value of '1' MRAM cell 300$_1$ retains the LRS and MRAM cell 300$_2$ retains the LRS even after the removal of the applied write voltage and, as such, MRAM cell 300$_1$ and MRAM cell 300$_2$ are a non-volatile.

In the depicted (III) example, a low write voltage is written as input A and a high write voltage is applied as input B. The high write voltage is therefore adopted as the voltage at node 412. A resulting programming current through each RAM cell 400$_1$ and RAM cell 400$_2$ results in both RAM cell 400$_1$ and RAM cell 400$_2$ being programmed in the LRS and resultantly acquiring a respective logic value '1'.

In ReRAM cell 200 embodiments, a low write voltage is written as input A and a high write voltage is applied as input B. The high write voltage is therefore adopted as the voltage at node 412. A resulting programming current through ReRAM cell 200$_2$ causes sufficient breakdown of the MIM structure and formation of CFs 204 occurs. This results in the LRS of ReRAM cell 200$_2$ and ReRAM cell 200$_2$ effectively stores a logic value of '1' A resulting programming current through ReRAM cell 200$_1$ causes sufficient breakdown of the MIM structure and sufficient formation of CFs 204 occurs. This results in the LRS of ReRAM cell 200$_1$ and ReRAM cell 200$_1$ effectively stores a logic value of '1'. ReRAM cell 200$_1$ and ReRAM cell 200$_2$ retains the LRS even after the removal of the applied write voltage and, as such, ReRAM cell 200$_1$ and ReRAM cell 200$_2$ are a non-volatile.

In MRAM cell 300 embodiments, a low write voltage is written as input A and a high write voltage is applied as input B. The high write voltage is therefore adopted as the voltage at node 412. A resulting programming current associated with MRAM cell 300$_2$ causes the appropriate magnetic field such that, in MRAM cell 300$_2$, the magnetic field orientation in free layer 312 is parallel with the magnetic field orientation of fixed layer 304, thereby placing MRAM cell 300$_2$ in the LRS and effectively storing a logic value of '1' A resulting programming current associated with MRAM cell 300$_1$ causes the appropriate magnetic field such that, in MRAM cell 300$_1$, the magnetic field orientation in free layer 312 is parallel with the magnetic field orientation of fixed layer 304, thereby placing MRAM cell 300$_1$ in the LRS and effectively storing a logic value of '1'. MRAM cell 300$_1$ and MRAM cell 300$_2$ retains the LRS even after the removal of the applied write voltage and, as such, MRAM cell 300$_1$ and MRAM cell 300$_2$ are a non-volatile.

In the depicted (IV) example, a high write voltage is written as input A at input node 402 to RAM cell 400$_1$ and a high write voltage is written as input B at input node 404 to RAM cell 400$_2$. The high write voltage applied to RAM cell 400$_1$ and the high write voltage applied to RAM cell 400$_2$ results in RAM cell 400$_1$ being programmed in the LRS and resultantly acquiring a logic value '0' and RAM cell 400$_2$ being programmed in the LRS and resultantly acquiring a respective logic value '1.'

In ReRAM cell 200 embodiments, a high write voltage is written as input A and a high write voltage is applied as input B. The high write voltage is therefore adopted as the voltage at node 412. A resulting programming current through ReRAM cell 200$_2$ causes sufficient breakdown of the MIM structure and sufficient formation of CFs 204 occurs. This results in the LRS of ReRAM cell 200$_2$ and ReRAM cell 200$_2$ effectively stores a logic value of '1' Likewise, the resulting programming current through ReRAM cell 200$_1$ also causes sufficient breakdown of the MIM structure and sufficient formation of CFs 204 occurs. This results in the LRS of ReRAM cell 200$_1$ and ReRAM cell 200$_1$ effectively stores a logic value of '1' ReRAM cell 200$_1$ and ReRAM cell 200$_2$ retains the LRS even after the removal of the applied write voltage and, as such, ReRAM cell 200$_1$ and ReRAM cell 200$_2$ are a non-volatile.

In MRAM cell 300 embodiments, a high write voltage is written as input A and a high write voltage is applied as input B. The high write voltage is therefore adopted as the voltage at node 412. A resulting programming current associated with MRAM cell 300$_2$ causes the appropriate magnetic field such that, in MRAM cell 300$_2$, the magnetic field orientation in free layer 312 is parallel with the magnetic field orientation of fixed layer 304, thereby placing MRAM cell 300$_2$ in the LRS and effectively storing s a logic value of '1'. The resulting programming current associated with MRAM cell 300$_1$ causes the appropriate magnetic field such that, in MRAM cell 300$_1$, the magnetic field orientation in free layer 312 is parallel with the magnetic field orientation of fixed layer 304, thereby placing MRAM cell 300$_1$ in the LRS and effectively storing a logic value of '1' MRAM cell 300$_1$ retains the LRS and MRAM cell 300$_2$ retains the LRS even after the removal of the applied write voltage and, as such, MRAM cell 300$_1$ and MRAM cell 300$_2$ are a non-volatile.

To determine the output at node 406, a read voltage is applied at input A and a read voltage is applied to input B. The read voltage is therefore adopted as the voltage at node 412.

The read voltage causes a read current to flow through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum may be, for example, low current (i.e., $i_L+i_L$) when RAM cell 400$_1$ and RAM cell 400$_2$ are each in the HRS or high current (i.e., $i_H+i_H$) when RAM cell 400$_1$ and RAM cell 400$_2$ are each in the LRS.

A resistance metric may be determined from the sensed current sum at node 406. For example, controller 510 may include a data structure that links a high resistance metric to the sensed low current (i.e., $i_L+i_L$) plus or minus an appropriate tolerance and that links a low resistance metric to the high current (i.e., $i_H+i_H$) plus or minus an appropriate tolerance. As such, when the current sum at node 406 is sensed, the resistance metric may be determined therefrom.

A predetermined reference value may be linked to a logical value "0" or "1" output. For example, a predetermined high resistance reference value may be linked to the logical output value "1", "high", or "ON," or the like and a predetermined low resistance reference value may be linked to the logical output value "0", "low", or "OFF," or the like.

For example, controller 510 may include a data structure that links a predetermined high resistance reference value, plus or minus a predetermined tolerance, to the logical value "1" and a predetermined low resistance reference value, plus or minus a predetermined tolerance, to the logical value "0". The determined resistance metric may be compared against the predetermined resistance reference values to determine the appropriate logical value output. For example, the determined resistance metric may be within the tolerance of the high resistance reference value and output at node 406 would therefore be a logical value '1' or may be within the tolerance of the low resistance value and output at node 406 would therefore be a logical value '0'.

In the depicted (I) example, a read voltage is applied at Input A and applied at Input B. Therefore, the read voltage is adopted as the voltage at node 412. A resulting read current flows through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum, as depicted, is the low current sum (i.e., $i_L+i_L$) as RAM cell 400$_1$ and RAM cell 400$_2$ are both in the HRS. The sensed low current sum indicates the high resistance metric. The high resistance metric is within the tolerance of the predetermined high resistance reference value which indicates the output at node as the logical value "1", "high", "TRUE", or the like.

In the depicted (II), (III), and (IV) examples, a read voltage is applied at Input A and applied at Input B. Therefore, the read voltage is adopted as the voltage at node 412. A resulting read current flows through the RAM cell 400$_1$ and the RAM cell 400$_2$, respectively. The read current is dependent on the state of RAM cell 400$_1$ and RAM cell 400$_2$. The output current at output node 406 is sensed as the current sum of the respective read currents through the RAM cells 400$_1$, 400$_2$. The current sum, as depicted, is the high current sum (i.e., $i_H+i_H$) as RAM cell 400$_1$ and RAM cell 400$_2$ are in the LRS. The sensed high current sum indicates the low resistance metric. The low resistance metric is within the tolerance of the predetermined low resistance reference value which indicates the output at node 406 as the logical value "0", "low", "FALSE", or the like.

The applied input A, the applied input B, and the read output at node 406 is shown in the depicted truth table. The truth table shows the a high or positive output at node 406 occurs only when both input A and input B are low or negative. Thus, a high '1' output at node 406 results if both the input A and input B are low '0'. If one or both input A and input B is high '1', a low '0' output at node 406 results. Therefore, as depicted, RRLG 420 is configured as a NOR device.

Figure 8:
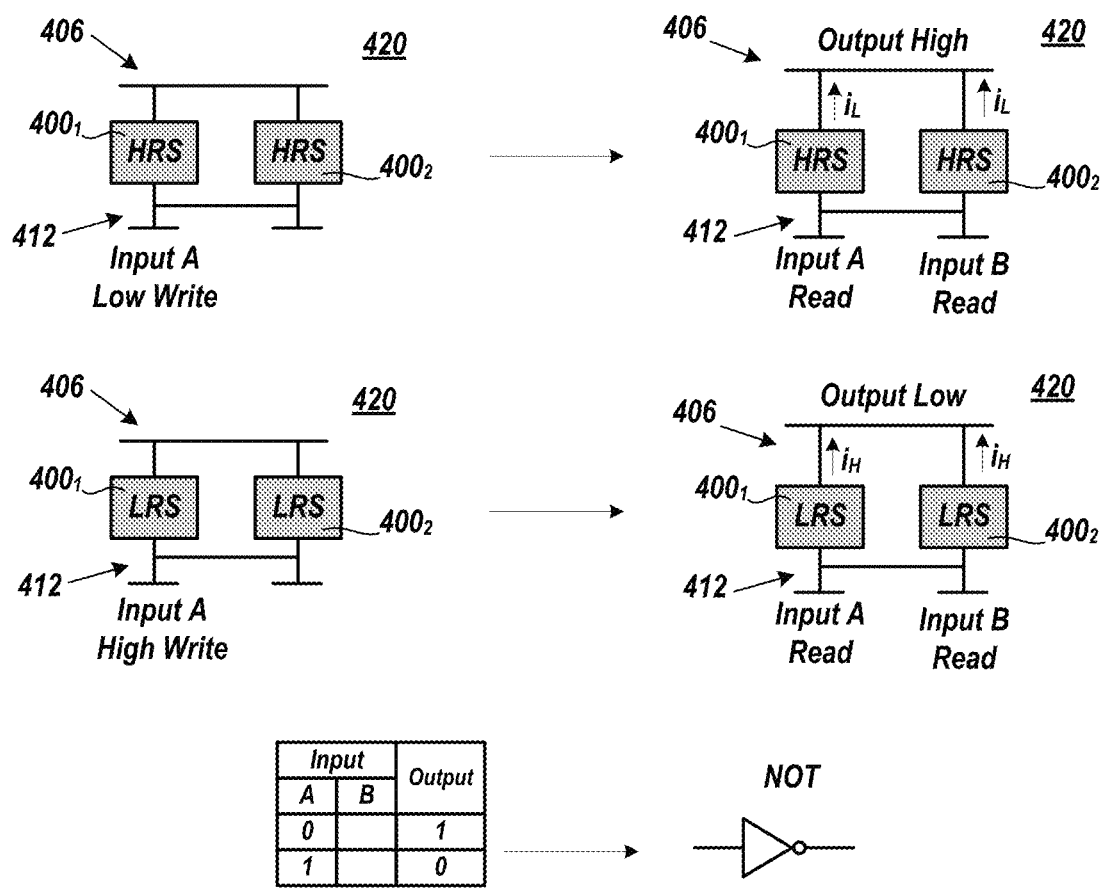
FIG. 8 depicts various logic states of a non-volatile resistive RAM logic gate, in accordance with various embodiments of the present invention.

FIG. 8 depicts various logic states of RRLG 420 in a NOT logic gate configuration, in accordance with various embodiments of the present invention. A NOT gate is a logic gate which implements logical negation. Thus, a high '1' output results if the input is low '0' and a low '0' output results if the input is high '1'.

In the depicted (I) example, a low write voltage is applied as input A. The low write voltage is therefore adopted as the voltage at node 412. A resulting programming current through each RAM cell $400_1$ and RAM cell $400_2$ results in the RAM cell $400_1$ and the RAM cell $400_2$ being programmed in the HRS. Each RAM cell $400_1$ and RAM cell $400_2$ resultantly acquires or maintains a respective logic value '0.'

In ReRAM cell 200 embodiments, a low write voltage is applied at input A. The low write voltage is therefore adopted as the voltage at node 412. A resulting programming current through ReRAM cell $200_1$ and a resulting programming current through ReRAM cell $200_2$ does not cause sufficient breakdown of the MIM structure and sufficient formation of CFs 204 does not occur. This results in the HRS of ReRAM cell $200_1$ and HRS of ReRAM cell $200_2$ and the ReRAM cell $200_1$ and ReRAM cell $200_2$ both effectively store a logic value of '0' ReRAM cell $200_1$ and ReRAM cell $200_2$ retain their respective HRS even after the removal of the applied write voltage and, as such, ReRAM cell $200_1$ and ReRAM cell $200_2$ are a non-volatile.

In MRAM cell 300 embodiments, a low write voltage is applied at input A. The low write voltage is therefore adopted as the voltage at node 412. A resulting programming current associated with MRAM cell $300_1$ and a resulting programming current through MRAM cell $300_2$ causes a magnetic field such that, in each cell, the magnetic field orientation in free layer 312 is antiparallel with the magnetic field orientation of fixed layer 304, respectively. This places both the MRAM cell $300_1$ and the MRAM cell $300_2$ in the HRS and the MRAM cell $300_1$ and the MRAM cell $300_2$ both effectively store a logic value of '0' MRAM cell $300_1$ and MRAM cell $300_2$ retain their respective HRS even after the removal of the applied write voltage and, as such, MRAM cell $300_1$ and MRAM cell $300_2$ are a non-volatile.

In the depicted (II) example, a high write voltage is applied as input A. The high write voltage is therefore adopted as the voltage at node 412. A resulting programming current through each RAM cell $400_1$ and RAM cell $400_2$ results in both RAM cell $400_1$ and RAM cell $400_2$ being programmed in the LRS and resultantly acquiring a respective logic value '1'.

In ReRAM cell 200 embodiments, a high write voltage is applied as input A. The high write voltage is therefore adopted as the voltage at node 412. A resulting programming current through ReRAM cell $200_2$ causes sufficient breakdown of the MIM structure and sufficient formation of CFs 204 occurs. This results in the LRS of ReRAM cell $200_2$ and ReRAM cell $200_2$ effectively stores a logic value of '1' A resulting programming current through ReRAM cell $200_1$ also causes sufficient breakdown of the MIM structure and sufficient formation of CFs 204 occurs. This results in the LRS of ReRAM cell $200_1$ and ReRAM cell $200_1$ effectively stores a logic value of '1'. ReRAM cell $200_1$ and ReRAM cell $200_2$ retains the LRS even after the removal of the applied write voltage and, as such, ReRAM cell $200_1$ and ReRAM cell $200_2$ are a non-volatile.

In MRAM cell 300 embodiments, a high write voltage is applied as input A. The high write voltage is therefore adopted as the voltage at node 412. A resulting programming current associated with MRAM cell $300_2$ causes the appropriate magnetic field such that, in MRAM cell $300_2$, the magnetic field orientation in free layer 312 is parallel with the magnetic field orientation of fixed layer 304, thereby placing MRAM cell $300_2$ in the LRS, whereby the MRAM cell $300_2$ effectively stores a logic value of '1'. A resulting programming current associated with MRAM cell $300_1$ also causes the appropriate magnetic field such that, in MRAM cell $300_1$, the magnetic field orientation in free layer 312 is parallel with the magnetic field orientation of fixed layer 304, thereby placing MRAM cell $300_1$ in the LRS, whereby the MRAM cell $300_1$ effectively stores a logic value of '1' MRAM cell $300_1$ and MRAM cell $300_2$ retains the LRS even after the removal of the applied write voltage and, as such, MRAM cell $300_1$ and MRAM cell $300_2$ are a non-volatile.

To determine the output at node 406, a read voltage is applied at input A. The read voltage is therefore adopted as the voltage at node 412. The read voltage causes a read current to flow through the RAM cell $400_1$ and the RAM cell $400_2$, respectively. The read current is dependent on the state of RAM cell $400_1$ and RAM cell $400_2$. The output current at output node 406 is sensed as the current sum of the respective read currents through the RAM cells $400_1$, $400_2$. The current sum may be, for example, low current (i.e., $i_L+i_L$) when RAM cell $400_1$ and RAM cell $400_2$ are each in the HRS or high current (i.e., $i_H+i_H$) when RAM cell $400_1$ and RAM cell $400_2$ are each in the LRS.

A resistance metric may be determined from the sensed current sum at node 406. For example, controller 510 may include a data structure that links a high resistance metric to the sensed low current (i.e., $i_L+i_L$) plus or minus an appropriate tolerance and that links a low resistance metric to the high current (i.e., $i_H+i_H$) plus or minus an appropriate tolerance. As such, when the current sum at node 406 is sensed, the resistance metric may be determined therefrom.

A predetermined reference value may be linked to a logical value "0" or "1" output. For example, a predetermined high resistance reference value may be linked to the logical output value "1", "high", or "ON," or the like and a predetermined low resistance reference value may be linked to the logical output value "0", "low", or "OFF," or the like.

For example, controller 510 may include a data structure that links a predetermined high resistance reference value, plus or minus a predetermined tolerance, to the logical value "1" and a predetermined low resistance reference value, plus or minus a predetermined tolerance, to the logical value "0". The determined resistance metric may be compared against the predetermined resistance reference values to determine the appropriate logical value output. For example, the determined resistance metric may be within the tolerance of the high resistance reference value and output at node 406 would therefore be a logical value '1' or may be within the tolerance of the low resistance value and output at node 406 would therefore be a logical value '0'.

In the depicted (I) example, a read voltage is applied at Input A. Therefore, the read voltage is adopted as the voltage at node 412. A resulting read current flows through the RAM cell $400_1$ and the RAM cell $400_2$, respectively. The read current is dependent on the state of RAM cell $400_1$ and RAM cell $400_2$. The output current at output node 406 is sensed as the current sum of the respective read currents through the RAM cells $400_1$, $400_2$. The current sum, as depicted, is the low current sum (i.e., $i_L+i_L$) as RAM cell $400_1$ and RAM cell $400_2$ are both in the HRS. The sensed low current sum indicates the high resistance metric. The high resistance metric is within the tolerance of the predetermined high resistance reference value which indicates the output at node 406 as the logical value "1", "high", "TRUE", or the like.

In the depicted (II) example, a read voltage is applied at Input A. Therefore, the read voltage is adopted as the voltage at node 412. A resulting read current flows through the RAM cell $400_1$ and the RAM cell $400_2$, respectively. The read current is dependent on the state of RAM cell $400_1$ and RAM cell $400_2$. The output current at output node 406 is sensed as the current sum of the respective read currents through the RAM cells $400_1$, $400_2$. The current sum, as depicted, is the high current sum (i.e., $i_H+i_H$) as RAM cell $400_1$ and RAM cell $400_2$ are in the LRS. The sensed high current sum indicates the low resistance metric. The low resistance metric is within the tolerance of the predetermined low resistance reference value which indicates the output at node 406 as the logical value "0", "low", "FALSE", or the like.

The applied input A and the read output at node 406 is shown in the depicted truth table. The truth table shows logical negation of the input A in relation to the output at node 406. Thus, a high '1' output at node 406 results if the input A is low '0' and a low '0' output at node 406 results if the input A is high '1'. Therefore, as depicted, RRLG 420 is configured as a NOT device.

Figure 9:
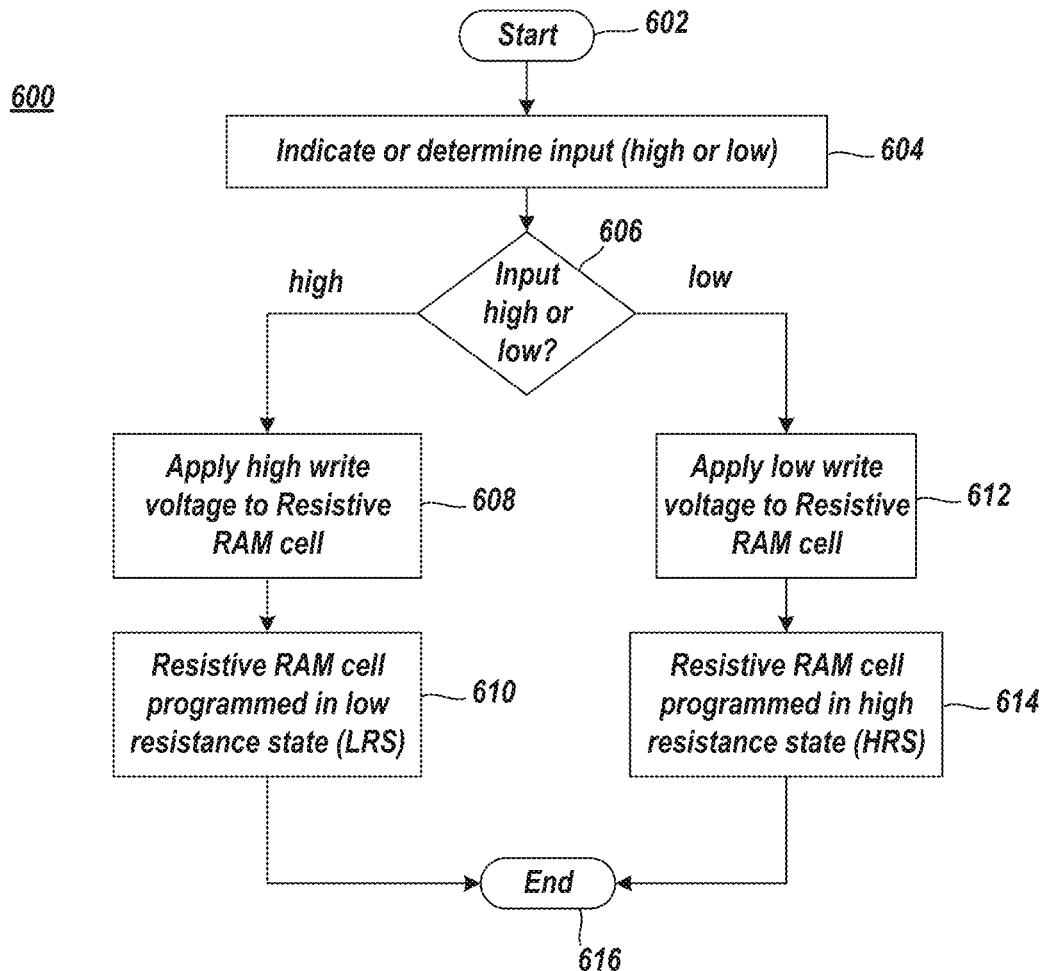
FIG. 9 depicts a method of programming a non-volatile resistive RAM logic gate, in accordance with various embodiments of the present invention.

FIG. 9 depicts a method 600 of programming RRLG 410, in accordance with various embodiments of the present invention. Method 600 blocks may be performed by, for example, controller 510, processing node, another known resistive RAM read/write controller. Method 600 begins at block 602 and continues with indicating or determining input A as either high '1' or low '0' and indicating or determining input B as high '1' or low '0' (block 604). For example, an output of a first upstream logic device may indicate input A as either high '1' or low '0' and an output of a second upstream logic device may indicate input B as either high '1' or low '0'. As such, the controller 510 may sense, be informed of, or otherwise determine that input A is either high '1' or low '0' and may sense, be informed of, or otherwise determine that input B is either high '1' or low '0'.

At bock 606 a decision is made whether input A has been indicated or determined as a high '1' or a low '0' and/or whether input B has been indicated or determined as a high '1' or a low '0'. If input A or input B is a high '1', a high write voltage is applied to RAM cell $400_1$ and/or to RAM cell $400_2$ (block 608). For example, controller 510 applies a high write voltage to the applicable node 402, 404 and a high write current flows across RAM cell $400_1$ and/or flows across RAM cell $400_2$. If a high write voltage is applied to RAM cell $400_1$ and/or to RAM cell $400_2$, the RAM cell $400_1$ and/or $400_2$ is programed in the LRS (block 610).

If input A or input B is a low '0', a low write voltage is applied to RAM cell $400_1$ and/or to RAM cell $400_2$ (block 612). For example, controller 510 applies a low write voltage to the applicable node 402, 404 and a low write current flows across RAM cell $400_1$ and/or flows across RAM cell $400_2$. If a low write voltage is applied to RAM cell $400_1$ and/or to RAM cell $400_2$, the RAM cell $400_1$ and/or $400_2$ is programed in the HRS (block 614). Method 600 may end at block 616.

Figure 10:
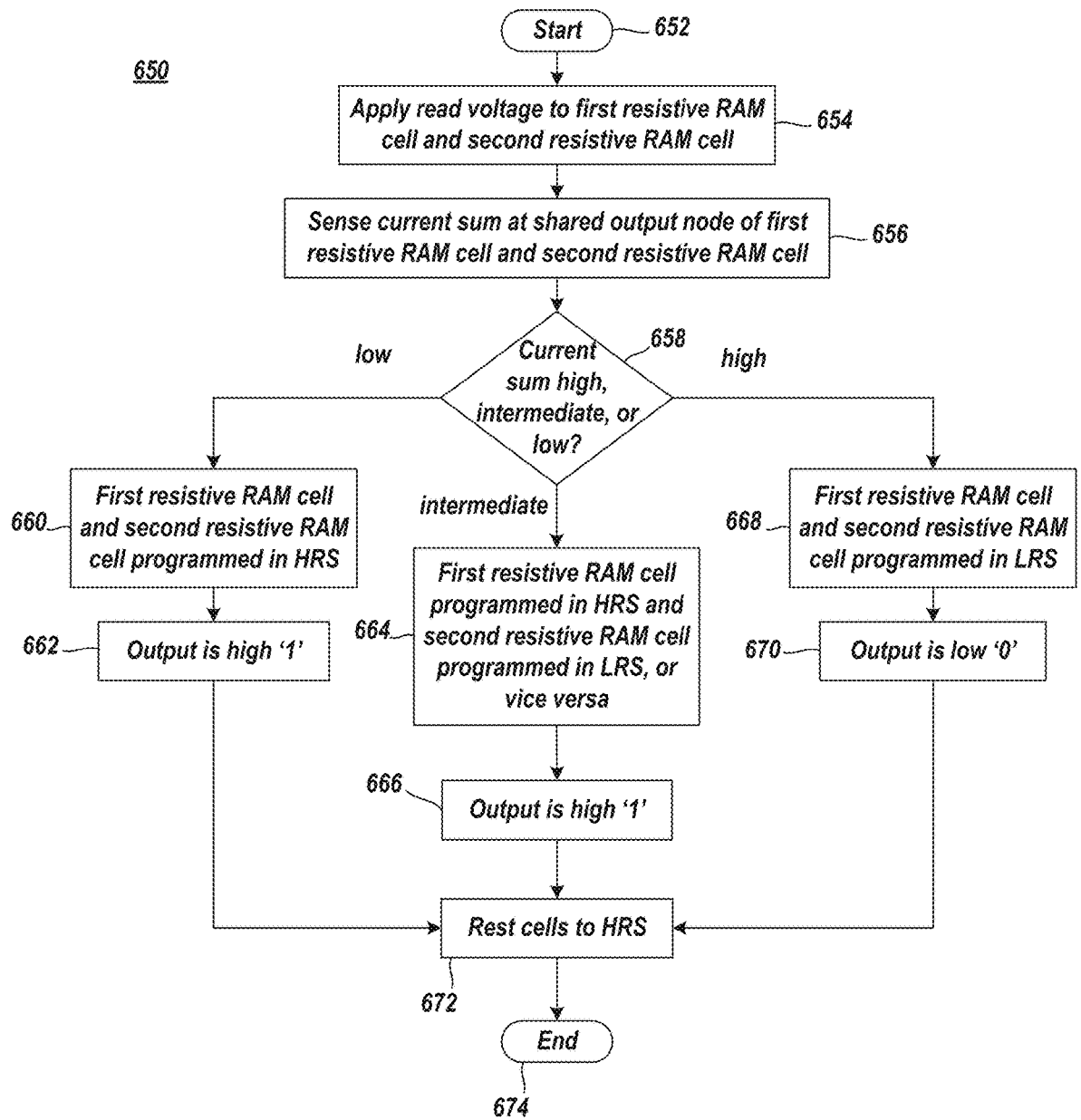
FIG. 10 depicts a method of reading an output of a non-volatile resistive RAM logic gate, in accordance with various embodiments of the present invention.

FIG. 10 depicts a method 650 of reading a logical output of RRLG 410, in accordance with various embodiments of the present invention. Method 650 blocks may be performed by, for example, controller 510, processing node, another known resistive RAM read/write controller.

Method 650 begins at block 652 and continues with applying a read voltage to a first resistive RAM cell and a read voltage to a second resistive RAM cell (block 654). For example, controller 510 applies a read voltage to node 402 and applies a read voltage to node 404 which causes a respective read current through RAM cell $400_1$ and through RAM cell $400_2$. The read current through RAM cell $400_1$ and through RAM cell $400_2$ depends upon the resistance state of RAM cell $400_1$ and RAM cell $400_2$, respectively. The read current through programmed RAM cells 400 may be low (i.e. $I_L$) when the RAM cell 400 is in the HRS or may be high (i.e. $I_H$) when the RAM cell 400 is in the LRS.

Method 650 may continue by sensing a current sum of the read current through RAM cell $400_1$ and the read current through RAM cell $400_2$ at an output node 406 shared by both RAM cell $400_1$ and RAM cell $400_2$ (block 656). The current sum may be a low current sum $(I_L+I_L)$, an intermediate current sum $(I_L+I_H)$, or a high current sum $(I_H+I_H)$.

Method 650 may continue by determining whether the current sum is a low current sum $(I_L+I_L)$, an intermediate current sum $(I_L+I_H)$, or a high current sum $(I_H+I_H)$ (block 658). The sensed current sum may be compared against predetermined reference values. For example, controller 510 may compare the sensed current sum against predetermined current sum reference values and determine whether the sensed current sum is within a predetermined tolerance of the low current sum, is within a predetermined tolerance of the intermediate current sum, or is within a predetermined tolerance of high current sum. Alternatively, controller 510 may derive a resistance metric from the sensed current sum and may compare the derived resistance metric against predetermined resistance reference values and determine whether the derived resistance metric equates to the low current sum, to the intermediate current sum, or to the high current sum.

If it is determined that the current sum is the low current sum, it is effectively determined that the first resistive RAM cell and the second resistive RAM cell are both programmed in the HRS (block 660) and the output of RRLG 410 at the shared node is set as high '1' (block 662). For example, if the controller 510 determines the sensed low current sum $(I_L+I_L)$ is within the tolerance of the predetermined low current sum reference value or equates to be within the tolerance of the predetermined high resistance reference value, then the controller 510 effectively determines that both RAM cell $400_1$ and RAM cell $400_2$ are programed in the HRS and the output of RRLG 410 at the shared output node 406 is high '1'.

If it is determined that the current sum is the intermediate current sum, it is effectively determined that either one of the first resistive RAM cell or the second resistive RAM cell is programmed in the HRS and the other is programed in the LRS (block 664) and the output of RRLG 410 at the shared node is set as high '1' (block 666). For example, if the controller 510 determines the sensed intermediate current sum $(I_L+I_H)$ is within the tolerance of the predetermined intermediate current sum reference value or equates to be within the tolerance of the predetermined intermediate resistance reference value, then the controller 510 effectively determines that one of the RAM cell $400_1$ or RAM cell $400_2$ is programed in the HRS and the other cell is programed in the LRS and the output of RRLG 410 at the shared output node 406 is high '1'.

If it is determined that the current sum is the high current sum, it is effectively determined that the first resistive RAM cell and the second resistive RAM cell are both programmed in the LRS (block 668) and the output of RRLG 410 at the shared node is set as low '0' (block 670). For example, if the controller 510 determines the sensed high current sum ($I_H+I_H$) is within the tolerance of the predetermined high current sum reference value or equates to be within the tolerance of the predetermined low resistance reference value, then the controller 510 effectively determines that both RAM cell 400$_1$ and RAM cell 400$_2$ are programed in the LRS and the output of RRLG 410 at the shared output node 406 is low '0'.

Method 650 may continue with conducting reset operations to place or otherwise ensure that the first resistive RAM cell and the second resistive RAM cell are in the HRS (block 672). For example, memory controller 510 may receive a reset request from a requesting device and may, upon receipt thereof, then reset the resistive RAM cells. The reset of the resistive ram cell places the RAM cell into the HRS state if it is not already. For example, after the controller 510 determines that both RAM cell 400$_1$ and RAM cell 400$_2$ are programed in the LRS and the output of RRLG 410 at the shared output node 406 is low '0' (in block 668, 760), the controller 510 may apply an applicable reset voltage to both RAM cell 400$_1$ and RAM cell 400$_2$ to place both cells from the LRS to the HRS. Method 650 may end at block 674.

Figure 11:
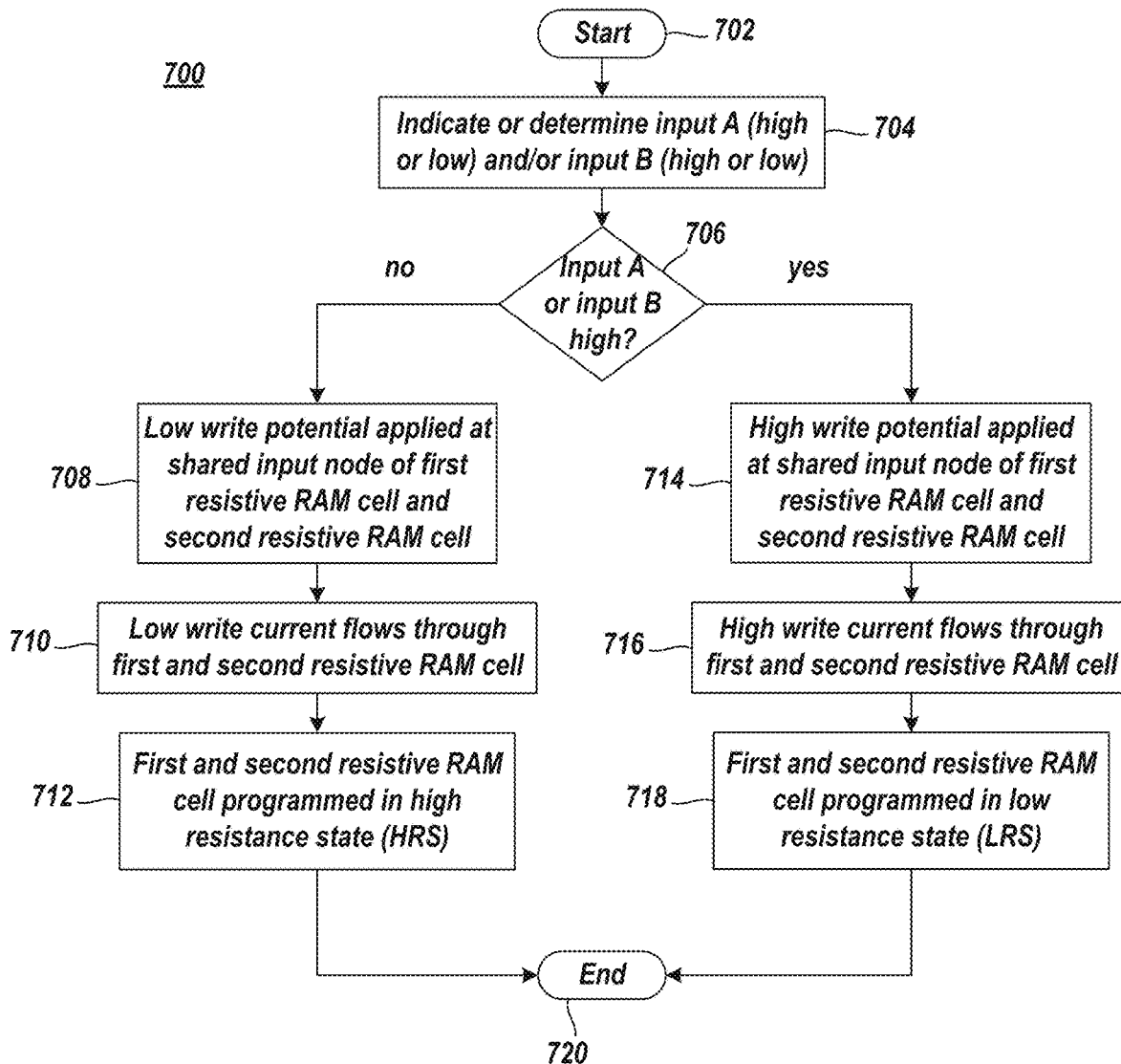
FIG. 11 depicts a method of programming a non-volatile resistive RAM logic gate, in accordance with various embodiments of the present invention.

FIG. 11 depicts a method 700 of programming of RRLG 420, in accordance with various embodiments of the present invention. Method 700 blocks may be performed by, for example, controller 510, processing node, another known resistive RAM read/write controller. Method 700 begins at block 702 and continues with indicating or determining input A as either high '1' or low '0' and/or indicating or determining input B as high '1' or low '0' (block 704). For clarity, when RRLG 420 is implemented as a NOR device, both input A and input B are indicated or determined and when RRLG 420 is implemented as a NOT device, input A is indicated or determined. The input A may be indicated by respective outputs of a first upstream logic device and/or the input B may be indicated by a second upstream logic device. As such, the controller 510 may sense, be informed of, or otherwise determine that input A is either high '1' or low '0' and may sense, be informed of, or otherwise determine that input B is either high '1' or low '0'.

At bock 706 a decision is made whether input A has been indicated or determined as a high '1' or a low '0' and/or whether input B has been indicated or determined as a high '1' or a low '0' (block 706). If at block 706 both input A or input B is a low '0', a low write voltage is applied to both resistive RAM cells at an input node that is shared by both resistive RAM cells (block 708). For example, controller 510 applies a low write voltage to the input node 412 shared by both RAM cell 400$_1$ and the RAM cell 400$_2$.

Method 700 may continue with forcing a low write current through both the resistive RAM cells (block 710). For example, the low write voltage applied to the shared input node 412 forces a low write current across both RAM cell 400$_1$ and/or flows across RAM cell 400$_2$. If a low write voltage is applied to both resistive RAM cells, each resistive RAM cell is programed in the HRS (block 712). For example, the low write current across the RAM cell 400$_1$ and/or the RAM cell 400$_2$, programs the RAM cell 400$_1$ and/or 400$_2$ in the HRS.

If at block 706 either one of or both input A or input B is a high '1', a high write voltage is applied to both resistive RAM cells at an input node that is shared by both resistive RAM cells (block 714). For example, controller 510 applies a high write voltage to the input node 412 shared by both RAM cell 400$_1$ and the RAM cell 400$_2$.

Method 700 may continue with forcing a high write current through both the resistive RAM cells (block 716). For example, the high write voltage applied to the shared input node 412 forces a high write current through both RAM cell 400$_1$ and RAM cell 400$_2$, respectively. If a high write voltage is applied to the shared node and a high write current flows through both resistive RAM cells, each resistive RAM cell is programed in the LRS (block 718). For example, the high write current through the RAM cell 400$_1$ and through the RAM cell 400$_2$, programs the RAM cell 400$_1$ and/or 400$_2$ in the LRS. Method 700 may end at block 620.

Figure 12:
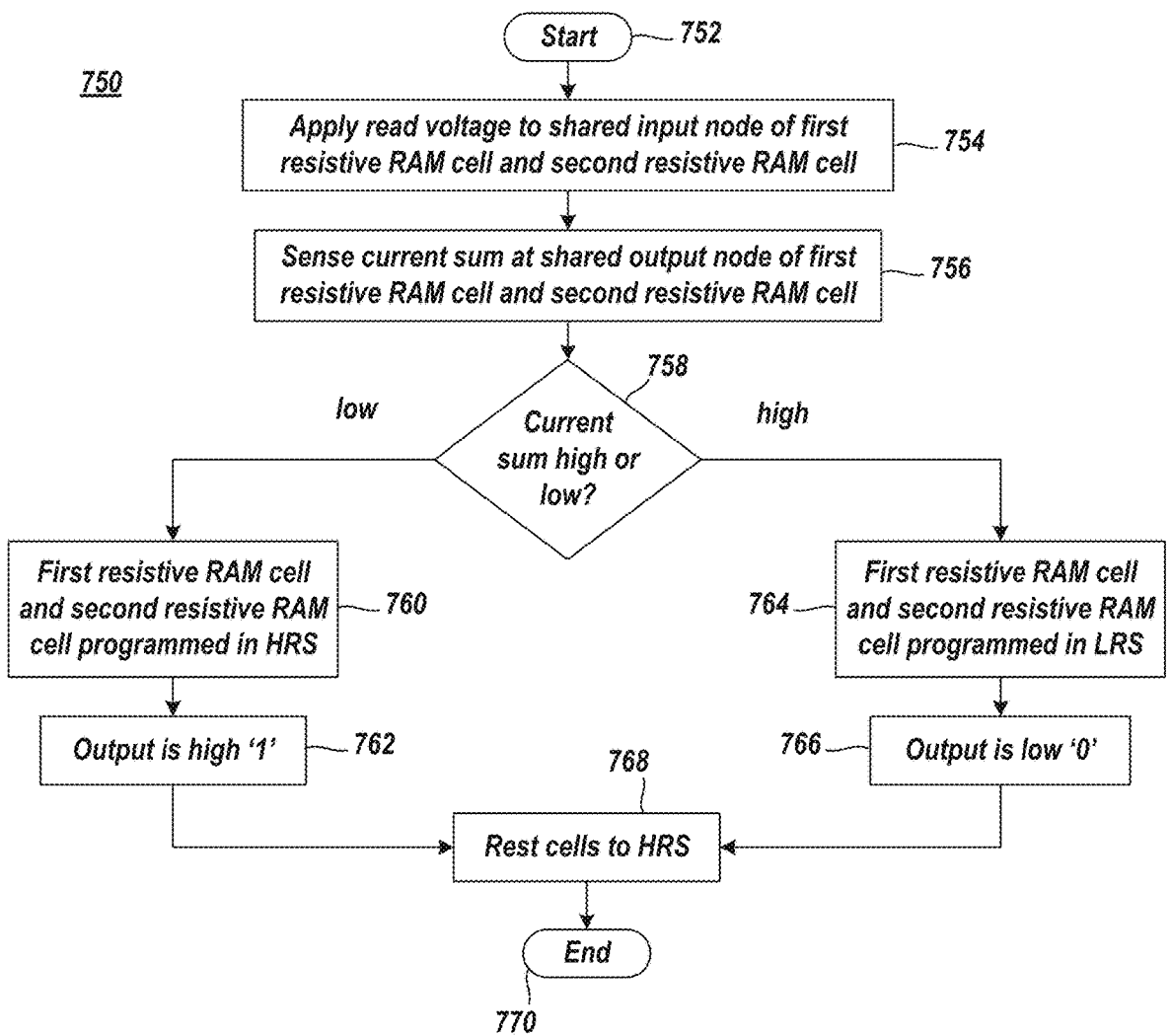
FIG. 12 depicts a method of reading an output of a non-volatile resistive RAM logic gate, in accordance with various embodiments of the present invention.

FIG. 12 depicts a method 750 of reading a logical output of RRLG 410, in accordance with various embodiments of the present invention. Method 750 blocks may be performed by, for example, controller 510, processing node, another known resistive RAM read/write controller.

Method 750 begins at block 752 and continues with applying a read voltage to a node shared by both a first resistive RAM cell and a second resistive RAM cell (block 754). For example, controller 510 applies a read voltage to node 412 which causes a respective read current through RAM cell 400$_1$ and through RAM cell 400$_2$. The read current through RAM cell 400$_1$ and through RAM cell 400$_2$ depends upon the resistance state of RAM cell 400$_1$ and RAM cell 400$_2$, respectively. The read current through programmed each of the resistive RAM cells may be low (i.e. $I_L$) when the RAM cell 400 is in the HRS or may be high (i.e. $I_H$) when the RAM cell 400 is in the LRS.

Method 750 may continue by sensing a current sum of the read current through the first resistive RAM cell and the read current through the second resistive RAM cell at an output node shared by both cells (block 756). For example, the current sum of the read current through RAM cell 400$_1$ and the read current through RAM cell 400$_2$ is sensed. The current sum may be a low current sum ($I_L+I_L$) or a high current sum ($I_H+I_H$).

Method 750 may continue by determining whether the current sum is a low current sum ($I_L+I_L$) or a high current sum ($I_H+I_H$) (block 758). The sensed current sum may be compared against predetermined reference values. For example, the sensed current sum may be compared against predetermined current sum reference values to determine whether the sensed current sum is within a predetermined tolerance of the low current sum or is within a predetermined tolerance of high current sum. Alternatively, a resistance metric may be derived from the sensed current sum and the derived resistance metric may be compared against predetermined resistance reference values to determine whether the derived resistance metric equates to the low current sum or to the high current sum.

If it is determined that the current sum is the low current sum, it is effectively determined that the first resistive RAM cell and the second resistive RAM cell are both programmed in the HRS (block 760) and the output of RRLG 410 at the shared node is set as high '1' (block 762). For example, if the controller 510 determines the sensed low current sum ($I_L+I_L$) is within the tolerance of the predetermined low current sum reference value or equates to be within the tolerance of the predetermined high resistance reference value, then the controller 510 effectively determines that both RAM cell 400$_1$ and RAM cell 400$_2$ are programed in the HRS and the output of RRLG 410 at the shared output node 406 is high '1'.

If it is determined that the current sum is the high current sum, it is effectively determined that both of the first resistive RAM cell and the second resistive RAM cell are programmed in the LRS (block 764) and the output of RRLG 410 at the shared node is set as low '0' (block 766). For example, if the controller 510 determines the sensed high current sum ($I_H+I_H$) is within the tolerance of the predetermined high current sum reference value or equates to be within the tolerance of the predetermined low resistance reference value, then the controller 510 effectively determines that both RAM cell 400₁ and RAM cell 400₂ are programed in the LRS and the output of RRLG 410 at the shared output node 406 is low '0'.

Method 750 may continue with conducting reset operations to place or otherwise ensure that the first resistive RAM cell and the second resistive RAM cell are in the HRS (block 768). For example, memory controller 510 may receive a reset request from a requesting device and may, upon receipt thereof, then reset the resistive RAM cells. The reset of the resistive ram cell places the RAM cell into the HRS state if it is not already. For example, after the controller 510 determines that both RAM cell 400₁ and RAM cell 400₂ are programed in the LRS and the output of RRLG 420 at the shared output node 406 is low '0' (in block 668, 760), the controller 510 may apply an applicable reset voltage to both RAM cell 400₁ and RAM cell 400₂ to place both cells from the LRS to the HRS. Method 750 may end at block 770.

In the various embodiments, resistive RAM logic devices are presented. These logic devices may operate more slowly than known CMOS logic devices. For example, to write or program these devices both a refresh step and a programing step may occur. However, the resistive RAM logic devices offer other benefits. Namely, such devices may be fabricated on numerous substrates or locations in the IC device. For example, these devices may be located in the BEOL levels of the IC device. As such, the resistive RAM logic devices contemplated herein do not necessarily need to be fabricated on a silicon substrate, like known CMOS logic devices. Another benefit of the resistive RAM logic devices is that they are low power due to their non-volatile nature where they maintain their logic state even when power is not applied thereto. As such, no power needs to be applied thereto when not in operation. Another benefit is that the logic cell (i.e. the pair of resistive RAM cells) can be configured as a logic device as is contemplated herein but may also be utilized as traditional storage cells. Therefore, such logic cells offer a solution where a mixed logic and memory device would be useful (i.e. FPGA device, or the like).

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

What is claimed is:

1. A resistance switching random access memory (RAM) NAND device comprising:
   a first resistive RAM (RRAM) cell and a first input node electrically connected to the first RRAM cell;
   a second RRAM cell and a second input node electrically connected to the second RRAM cell; and
   a shared output node electrically connected to both the first RRAM cell and the second RRAM cell.

2. The resistance switching RAM NAND device of claim 1, wherein when both the first RRAM cell and the second RRAM cell are in a high resistance state (HRS), a logical high '1' is present on the shared output node.

3. The resistance switching RAM NAND device of claim 1, wherein when only one of the first RRAM cell or the second RRAM cell is in a high resistance state (HRS) and the other of the first RRAM cell or the second RRAM cell is in a low resistance state (LRS), a logical high '1' is present on the shared output node.

4. The resistance switching RAM NAND device of claim 1, wherein when both the first RRAM cell and the second RRAM cell are in a low resistance state (LRS), a logical low '0' is present on the shared output node.

5. The resistance switching RAM NAND device of claim 2, wherein a low current sum is sensed at the shared output node, the low current sum comprising a sum of a first low read current through the first RRAM cell and a second low read current through the second RRAM cell.

6. The resistance switching RAM NAND device of claim 3, wherein an intermediate current sum is sensed at the shared output node, the intermediate current sum comprising a sum of a low read current through the first RRAM cell and a high read current through the second RRAM cell.

7. The resistance switching RAM NAND device of claim 3, wherein an intermediate current sum is sensed at the shared output node, the intermediate current sum comprising a sum of a high read current through the first RRAM cell and a low read current through the second RRAM cell.

8. The resistance switching RAM NAND device of claim 4, wherein a high current sum is sensed at the shared output node, the high current sum comprising a sum of a first high read current through the first RRAM cell and a second high read current through the second RRAM cell.

9. A resistance switching random access memory (RAM) NOR device comprising:
   a first resistive RAM (RRAM) cell;
   a second RRAM cell;
   a shared input node electrically connected to both the first RRAM cell and to the second RRAM cell, the shared input node comprising a first input and a second input; and
   a shared output node electrically connected to both the first RRAM cell and to the second RRAM cell.

10. The resistance switching RAM NOR device of claim 9, wherein when both the cell first RRAM cell and the second RRAM cell are in a high resistance state (HRS), a logical high '1' is present on the shared output node.

11. The resistance switching RAM NOR device of claim 9, wherein when one or both of the first RRAM cell and or the second RRAM cell is in a low resistance state (LRS), a logical low '0' is present on the shared output node.

12. A resistance switching random access memory (RAM) NAND device comprising:
   a first magnetoresistive RAM (MRAM) cell and a first input node electrically connected to the first MRAM cell;
   a second MRAM cell and a second input node electrically connected to the second MRAM cell; and
   a shared output node electrically connected to both the first MRAM cell and the second MRAM cell.

13. The resistance switching RAM NAND device of claim 12, wherein when both the first MRAM cell and the second MRAM cell are in a high resistance state (HRS), a logical high '1' is present on the shared output node.

14. The resistance switching RAM NAND device of claim 12, wherein when only one of the first MRAM cell or the second MRAM cell is in a high resistance state (HRS) and the other of the first MRAM cell or the second MRAM cell is in a low resistance state (LRS), a logical high '1' is present on the shared output node.

15. The resistance switching RAM NAND device of claim 12, wherein when both the first MRAM cell and the second MRAM cell are in a low resistance state (LRS), a logical low '0' is present on the shared output node.

16. The resistance switching RAM NAND device of claim 13, wherein a low current sum is sensed at the shared output node, the low current sum comprising a sum of a first low read current through the first MRAM cell and a second low read current through the second MRAM cell.

17. The resistance switching RAM NAND device of claim 14, wherein an intermediate current sum is sensed at the shared output node, the intermediate current sum comprising a sum of a low read current through the first MRAM cell and a high read current through the second MRAM cell.

18. The resistance switching RAM NAND device of claim 14, wherein an intermediate current sum is sensed at the shared output node, the intermediate current sum comprising a sum of a high read current through the first MRAM cell and a low read current through the second MRAM cell.

19. The resistance switching RAM NAND device of claim 15, wherein a high current sum is sensed at the shared output node, the high current sum comprising a sum of a first high read current through the first MRAM cell and a second high read current through the second RAM cell.

\* \* \* \* \*